(12) United States Patent
Kim et al.

(10) Patent No.: US 9,773,950 B2
(45) Date of Patent: Sep. 26, 2017

(54) SEMICONDUCTOR DEVICE STRUCTURE

(71) Applicant: CTLAB CO., LTD., Gyeonggi-do (KR)

(72) Inventors: Chang Tae Kim, Gyeonggi-do (KR);
Jae Sung Ko, Gyeonggi-do (KR); Seok Jung Kim, Gyeonggi-do (KR); Chang Hun Lee, Gyeonggi-do (KR)

(73) Assignee: CTLAB CO. LTD., Gyeonggi-Do (KR)

( * ) Notice: Subject to any disclaimer, the term of this patent is extended or adjusted under 35 U.S.C. 154(b) by 0 days.

(21) Appl. No.: 14/390,611

(22) PCT Filed: Apr. 5, 2013

(86) PCT No.: PCT/KR2013/002879
§ 371 (c)(1),
(2) Date: Oct. 3, 2014

(87) PCT Pub. No.: WO2013/151387
PCT Pub. Date: Oct. 10, 2013

(65) Prior Publication Data
US 2015/0091035 A1 Apr. 2, 2015

(30) Foreign Application Priority Data

Apr. 6, 2012 (KR) .................... 10-2012-0036182
Aug. 24, 2012 (KR) .................... 10-2012-0093191
(Continued)

(51) Int. Cl.
*H01L 29/22* (2006.01)
*H01L 33/46* (2010.01)
(Continued)

(52) U.S. Cl.
CPC ............ *H01L 33/46* (2013.01); *H01L 33/42* (2013.01); *H01L 33/507* (2013.01); *H01L 33/52* (2013.01);
(Continued)

(58) Field of Classification Search
CPC ......... H01L 33/10; H01L 33/46; H01L 33/52; H01L 33/60
(Continued)

(56) References Cited

U.S. PATENT DOCUMENTS

| 7,497,597 B2 | 3/2009 | Suehiro et al. ............... 362/294 |
| 2004/0115849 A1 | 6/2004 | Iwafuchi et al. ............... 438/25 |

(Continued)

FOREIGN PATENT DOCUMENTS

| JP | 2006-024615 | 1/2006 |
| JP | 2006-120913 | 11/2006 |

(Continued)

OTHER PUBLICATIONS

International Search Report dated Jul. 10, 2013, issued in International Patent Application No. PCT/KR2013/002879 with English translation; 10 pgs.

*Primary Examiner* — Matthew E Warren
(74) *Attorney, Agent, or Firm* — Harness, Dickey & Pierce, P.L.C.

(57) ABSTRACT

The present disclosure relates to a method for manufacturing a semiconductor device structure, comprising the steps of: securing the position of a semiconductor device on a plate; securing the positions of electrodes such that the electrodes face the plate; covering the semiconductor device with an encapsulating material; and separating, from the plate, the semiconductor device covered with the encapsulating material.

8 Claims, 30 Drawing Sheets

(30) Foreign Application Priority Data

| Aug. 24, 2012 | (KR) | 10-2012-0093193 |
|---|---|---|
| Aug. 24, 2012 | (KR) | 10-2012-0093201 |
| Aug. 24, 2012 | (KR) | 10-2012-0093208 |
| Aug. 24, 2012 | (KR) | 10-2012-0093213 |
| Jan. 23, 2013 | (KR) | 10-2013-0007331 |

(51) Int. Cl.
| $H01L\ 33/52$ | (2010.01) |
|---|---|
| $H01L\ 33/54$ | (2010.01) |
| $H01L\ 33/62$ | (2010.01) |
| $H01L\ 33/42$ | (2010.01) |
| $H01L\ 33/50$ | (2010.01) |
| $H01L\ 33/58$ | (2010.01) |
| $H01L\ 33/64$ | (2010.01) |
| $H01L\ 33/48$ | (2010.01) |
| $H01L\ 33/60$ | (2010.01) |

(52) U.S. Cl.
CPC .............. *H01L 33/54* (2013.01); *H01L 33/58* (2013.01); *H01L 33/62* (2013.01); *H01L 33/644* (2013.01); *H01L 33/486* (2013.01); *H01L 33/60* (2013.01); *H01L 2224/48091* (2013.01); *H01L 2933/005* (2013.01); *H01L 2933/0033* (2013.01)

(58) Field of Classification Search
USPC .................................... 315/246; 257/98–100
See application file for complete search history.

(56) References Cited

U.S. PATENT DOCUMENTS

| 2010/0201280 A1* | 8/2010 | McKenzie | H01L 33/46 315/246 |
|---|---|---|---|
| 2014/0175481 A1* | 6/2014 | Tischler | H01L 27/14 257/98 |

FOREIGN PATENT DOCUMENTS

| JP | 2009-164423 | 7/2009 |
|---|---|---|
| KR | 10-2005-0116373 | 12/2005 |
| KR | 10-2010-0060867 | 6/2010 |

\* cited by examiner

SEMICONDUCTOR DEVICE STRUCTURE

CROSS-REFERENCE TO RELATED APPLICATIONS

This application is a national phase application of PCT Application No. PCT/KR2013/002879, filed on 5 Apr. 2013, which claims the benefit and priority to Korean Patent Application No. 10-2012-0036182, filed 6 Apr. 2012, Korean Patent Application No. 10-2012-0093191, filed 24 Aug. 2012, Korean Patent Application No. 10-2012-0093193, filed 24 Aug. 2012. Korean Patent Application No. 10-2012-0093201, filed 24 Aug. 2012, Korean Patent Application No. 10-2012-0093208, filed 24 Aug. 2012, Korean Patent Application No. 10-2012-0093213, filed 24 Aug. 2012 and to Korean Patent Application No. 10-2013-0007331, filed 23 Jan. 2013. The entire disclosures of the application identified in this paragraph are incorporated herein by references.

TECHNICAL FIELD

The present disclosure relates generally to a method for manufacturing a semiconductor device structure, and more particularly, to a method for manufacturing a semiconductor device structure which is of a simpler construction for manufacturing.

Within the context herein, the term "semiconductor device" encompasses semiconductor light emitting devices (e.g. laser diodes), semiconductor light receiving devices (e.g. photo diodes), p-n junction diode electric devices, semiconductor transistors and the like, and the typical example thereof is a group III-nitride semiconductor light emitting device. The group III-nitride semiconductor light emitting device means a light emitting device, such as a light emitting diode, including a compound semiconductor layer made of $Al_{(x)}Ga_{(y)}In_{(1-x-y)}N$ (wherein, $0 \leq x \leq 1$, $0 \leq y \leq 1$, $0 \leq x+y \leq 1$), while it does not necessarily exclude additional materials including elements of other groups, such as SiC, SiN, SiCN, CN or the like, or semiconductor layers made of those materials.

BACKGROUND

This section provides background information related to the present disclosure which is not necessarily prior art.

FIG. 1 is a view illustrating one example of the semiconductor light emitting device (Lateral Chip) in the prior art, in which the semiconductor light emitting device includes a substrate 100, and a buffer layer 200, a first semiconductor layer 300 having a first conductivity, an active layer 400 for generating light via electron-hole recombination and a second semiconductor layer 500 having a second conductivity different from the first conductivity, which are deposited over the substrate 100 in the order mentioned, and additionally, a light-transmitting conductive film 600 for current spreading, and an electrode 700 serving as a bonding pad are formed thereon, and an electrode 800 serving as a bonding pad is formed on an etch-exposed portion of the first semiconductor layer 300. In this example, the side of the substrate 100 placed on the package serves as a mounting face.

FIG. 2 is a view illustrating another example of the semiconductor light emitting device (Flip Chip) in the prior art, in which the semiconductor light emitting device includes a substrate 100 (e.g. a sapphire substrate), and a first semiconductor layer 300 having a first conductivity (e.g. an n-type GaN layer), an active layer 400 for generating light via electron-hole recombination (e.g. InGaN/(In)GaN MQWs) and a second semiconductor layer 500 having a second conductivity different from the first conductivity (e.g. a p-type GaN layer), which are deposited over the substrate 100 in the order mentioned, and additionally, three-layered electrode films for reflecting light towards the substrate 100, i.e., an electrode film 901 (e.g. an Ag reflective film), an electrode film 902 (e.g., a Ni diffusion barrier) and an electrode film 903 (e.g. an Au bonding layer) are formed thereon, and an electrode 800 (e.g. a Cr/Ni/Au laminate metal pad) serving as a bonding pad is formed on an etch-exposed portion of the first semiconductor layer 300. In this example, the side of the electrode film 903 placed on the package serves as a mounting face. In terms of the heat dissipation efficiency, the flip chip shown in FIG. 2 or the junction down type chip demonstrates outstanding performances over the ones with the lateral chip shown in FIG. 1. This is because the lateral chip should dissipate heat outside through the sapphire substrate 100 with a thickness of 80 to 180 µm, while the flip chip can dissipate heat through the metallic electrodes 901, 902 and 903 placed near the active layer 400.

FIG. 15 is a view illustrating one example of a semiconductor light emitting device package or a semiconductor light emitting device structure in the prior art, in which the semiconductor light emitting device package is provided with lead frames 110 and 120, a mold 130, and a vertical type light-emitting chip 150 in a cavity 140 which is filled with an encapsulating material 170 containing a phosphor 160. The bottom face of the vertical type light-emitting chip 150 is electrically connected to the lead frame 110, and the top face thereof is electrically connected to the lead frame 120. A portion of the light (e.g., blue light) emitting from the vertical type light-emitting chip 150 excites the phosphor 160 such that light (e.g. yellow light) is generated by the phosphor 160, and these lights (blue light+yellow light) produce white light. In this example, the mold 130—the encapsulating material 170, or the lead frame 110 and 120—the mold 130—the encapsulating material 170 serve as a support, that is, a carrier, for the semiconductor light emitting device package, while supporting the vertical semiconductor device.

FIG. 54 is a view illustrating one example of the semiconductor light emitting device (Flip Chip) described in JP Laid-Open Publication No. 2006-120913, in which the semiconductor light emitting device is of a flip chip type employing an insulating film 910 and a metal film 920, instead of the electrodes 901, 902 and 903 as in the semiconductor light emitting device shown in FIG. 2. The light L generated in the active layer 300 is usually reflected from the insulating film 910 and then reflected towards the first semiconductor layer 300 or the substrate 100. A portion of the light L is reflected from the metal film 920. Preferably, the insulating film 910 has a DBR. Any description of the same reference numerals will not be repeated.

FIG. 55 is a view illustrating one example of the semiconductor light emitting device (Flip Chip) described in JP Laid-Open Publication No. 2009-164423. This semiconductor light emitting device differs from the one shown in FIG. 54 in that the former is configured to have holes 910h in the insulating film 910 such the metal film 920 supplies current to the semiconductor light emitting device through a light-transmitting conductive film 600, while in the latter current is supplied through the electrode 700. Preferably, the insulating film 910 has a DBR, and is formed across the entire semiconductor light emitting device as well as on an etch-exposed portion of the first semiconductor layer 300. In addition, the metal film 920 is formed on the etch-exposed portion of the first semiconductor layer 300.

Technical Problem

The problems to be solved by the present disclosure will be described in the latter part of the best mode for carrying out the invention.

Technical Solution

This section provides a general summary of the disclosure and is not a comprehensive disclosure of its full scope or all of its features.

According to one aspect of the present disclosure, there is provided a method for manufacturing a semiconductor device structure, which comprises the steps of: securing the position of a semiconductor device on a plate; securing the positions of electrodes such that they face the plate; covering the semiconductor device with an encapsulating material; and separating, from the plate, the semiconductor device covered with the encapsulating material.

Advantageous Effects

The advantageous effects of the present disclosure will be described in the latter part of the best mode for carrying out the invention.

DESCRIPTION OF DRAWINGS

FIG. 54 is a view illustrating one example of the semiconductor light emitting device (Flip Chip) proposed in JP Laid-Open Publication No. 2009-164423.

DETAILED DESCRIPTION

Hereinafter, the present disclosure will now be described in detail with reference to the accompanying drawings.

Figure 3:
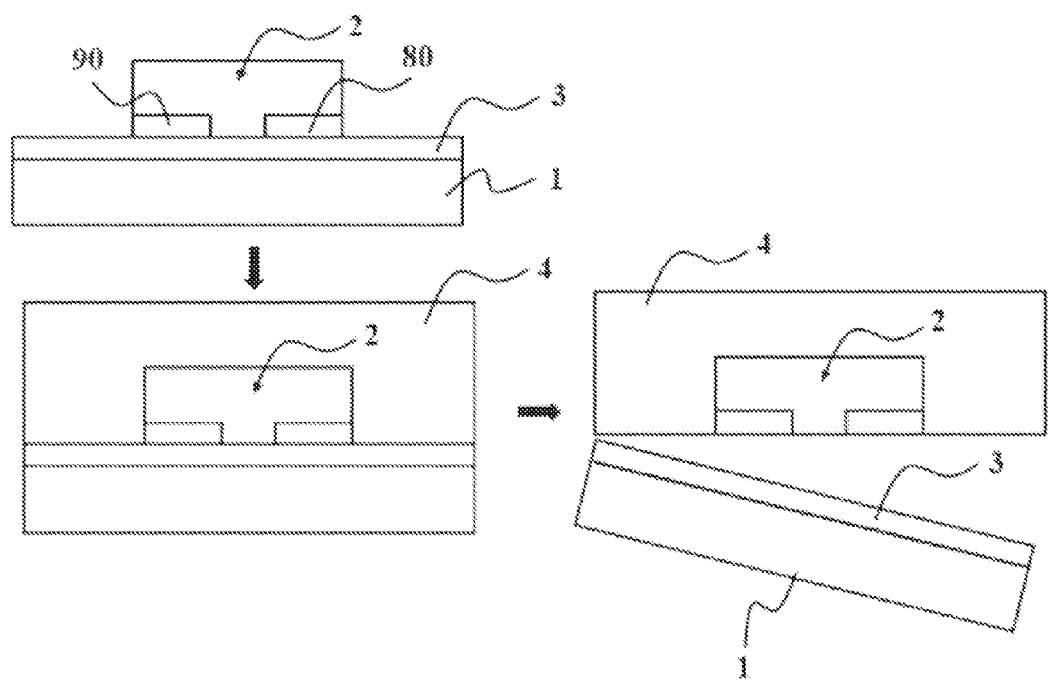
FIG. 3 is a view illustrating one example of the method for manufacturing a semiconductor device structure according to the present disclosure.

FIG. 3 is a view illustrating one example of the method for manufacturing a semiconductor device structure according to the present disclosure, in which a plate 1 is first prepared, and a semiconductor device 2 provided with two electrodes 80 and 90 is secured at a position on the plate 1 with an adhesive 3. Next, the semiconductor device 2 is surrounded with an encapsulating material 4, before separating the plate 1 and the semiconductor 2. The materials of the plate 1 are not particularly limited, and examples thereof encompass a material like sapphire or even a flat structure like a metal or glass, etc. When a rigid plate formed of a metal or glass, for example, is used, the stability of the process may be achieved, as compared with a case where a flexible plate such as Blue tape is used. Also, the materials of the adhesive 3 are not particularly limited, and any type of adhesive can employed as far as it can secure the plate 1 at a position on the semiconductor device 2. As to the materials of the adhesive 3, it is possible to use silicone epoxy, silicone resins and the like, which are typically used in the prior art LED packages. The separation of the plate 1 and the semiconductor device 2 after the encapsulating material 4 is formed can be carried out by applying heat or light capable of melting the adhesive 3, or by employing a solvent capable of dissolving the adhesive 3. It is also possible to combine the use of heat or light with the solvent. Moreover, it is also possible to use an adhesive tape. The encapsulating material 4 can be formed by conventional techniques, including dispensing, screen printing, molding, spin coating, the application of a stencil, for example. It may be formed by coating a photo-curable resin (UV-curable resin) thereon, followed by irradiating light. When a light-transmitting plate is used as the plate 1, it is also possible to irradiate light from the direction of the plate 1. Although the drawing illustrates only one semiconductor device 2 on the plate 1 for convenience of explanation, a plurality of semiconductor devices 2 on the plate 1 can undergo the process. While it has been stated that the semiconductor device 2 is provided with two electrodes 80 and 90, it should be understood that the number of electrodes is not particularly limited. For instance, a transistor can have three electrodes.

Figure 2:
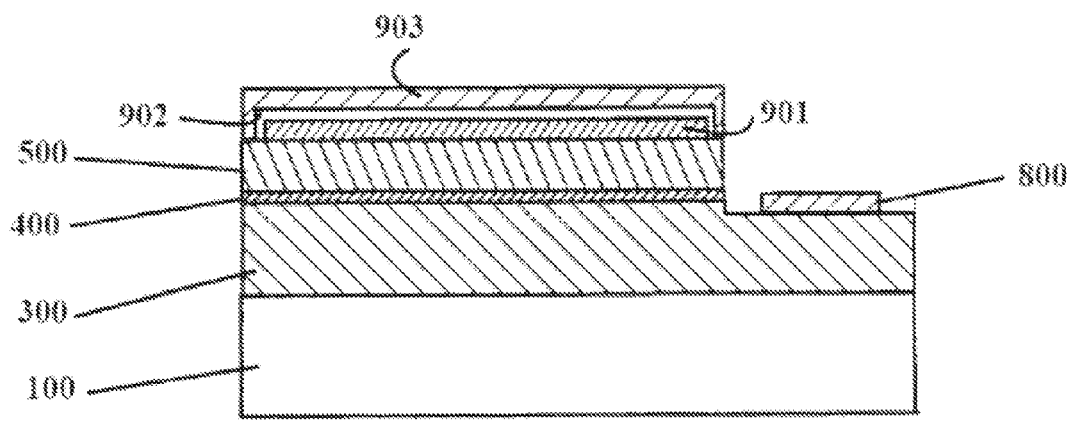
FIG. 2 is a view illustrating another example of a semiconductor light emitting device (Flip Chip) in the prior art.
Figure 4:
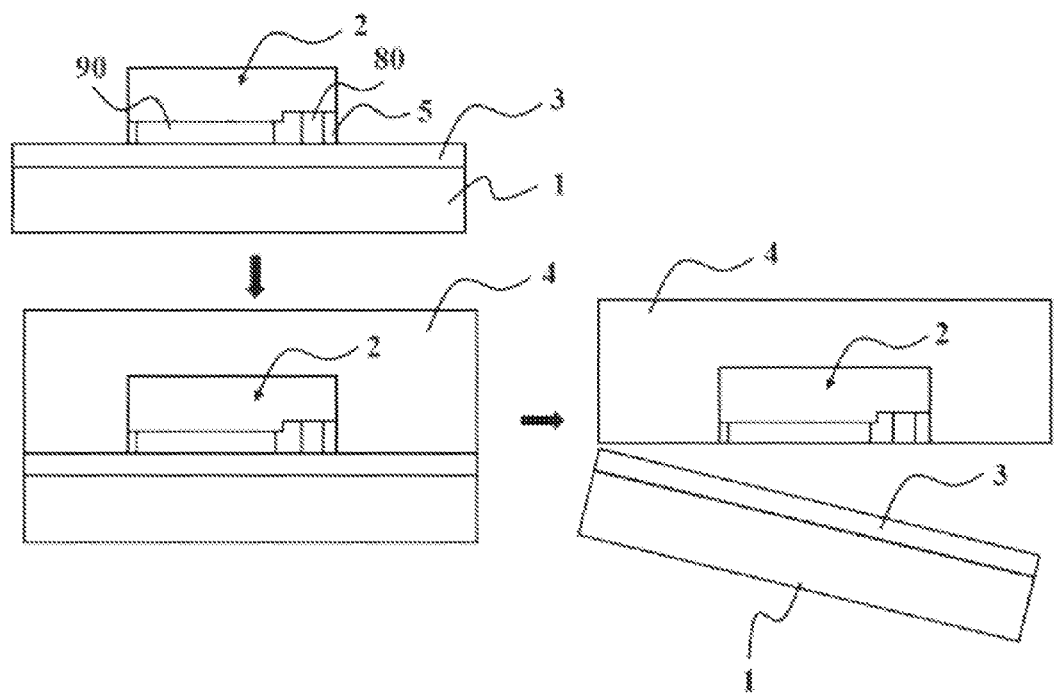
FIG. 4 is a view illustrating one example of the method for manufacturing a flip chip package according to the present disclosure.

FIG. 4 is a view illustrating one example of the method for manufacturing a flip chip package according to the present disclosure, in which a junction down type chip is shown as the semiconductor device 2. The flip chip type semiconductor light emitting device as illustrated in FIG. 2 can be mentioned as an example of this junction down type chip. Accordingly, as in FIG. 2, the semiconductor light emitting device can have a structure in which a first semiconductor layer 300 having a first conductivity (e.g. an n-type GaN layer), an active layer 400 for generating light via electron-hole recombination (e.g. InGaN/(In)GaN MQWs), and a second semiconductor layer 500 having a second conductivity different from the first conductivity (e.g. a p-type GaN layer) are deposited over a substrate 100 (e.g. a sapphire substrate) in the order mentioned, and additionally, three-layered electrode films for reflecting light towards the substrate 100, i.e., an electrode film 901 (e.g. an Ag reflective film), an electrode film 902 (e.g., a Ni diffusion barrier) and an electrode film 903 (e.g. an Au bonding layer) are formed thereon, and an electrode 800 (e.g. a Cr/Ni/Au laminate metal pad) serving as a bonding pad is formed on an etch-exposed portion of the first semiconductor layer 300. The semiconductor device 2 can have two electrodes 80 and 90, where the electrode 90 may have the same configuration as the electrodes 901, 902 and 903 or may have a combined configuration of a DBR (Distributed Bragg Reflector) with a metal reflective film. The electrode 80 and the electrode 90 are electrically isolated by an insulating film 5 such as $SiO_2$. The manufacturing procedure after this stays the same as above, i.e., the semiconductor device 2 is surrounded with the encapsulating material 4, and then the semiconductor device 2 is separated from the plate 1 and the adhesive 3.

Figure 5:
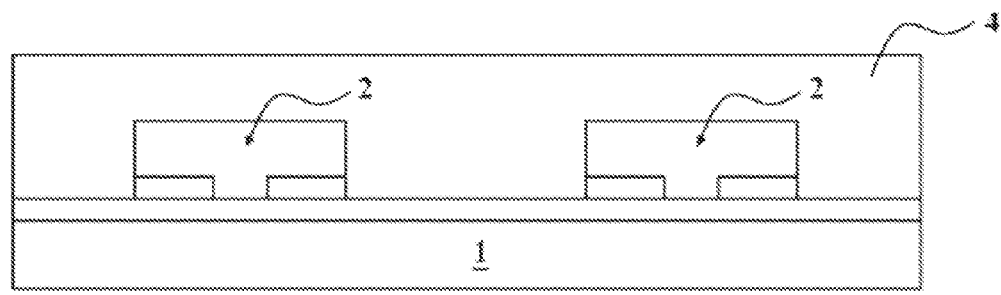
FIG. 5 is a view illustrating another example of the method for manufacturing a semiconductor device structure according to the present disclosure.

FIG. 5 is a view illustrating another example of the method for manufacturing a semiconductor device structure according to the present disclosure, in which a plurality of semiconductor devices 2 and 2 on the plate 1 is covered with the encapsulating material 4 as a whole. This facilitates making those semiconductor devices 2 and 2 into one package as a whole, after the plate 1 is removed. A process of electrical connection between the semiconductor device 2 and the semiconductor device 2 will be described below. Meanwhile, it is also possible to split them into individual semiconductor devices 2 as in FIG. 3. This can be achieved by a sawing process for example for individualizing the plural semiconductor devices 2 and 2 once they are separated from the plate 1. The use of such an encapsulating material 4 that tends to be flexible after undergoing the curing operation further increases the bonding between the semiconductor devices and a flexible circuit board.

Figure 6:
FIG. 6 is a view illustrating one example of a semiconductor device structure according to the present disclosure.

FIG. 6 is a view illustrating one example of a semiconductor device structure according to the present disclosure, in which the lateral faces of the encapsulating material 4 are sloped. When the semiconductor device 2 is a light emitting device, the encapsulating material 4 is given with the outer face of different angles, which in turn increases the light extraction efficiency towards the outside of a package. These lateral faces 4a can be obtained by inclining a screen barrier rib during the screen printing, using a pointed cutter during the sawing.

Figure 7:
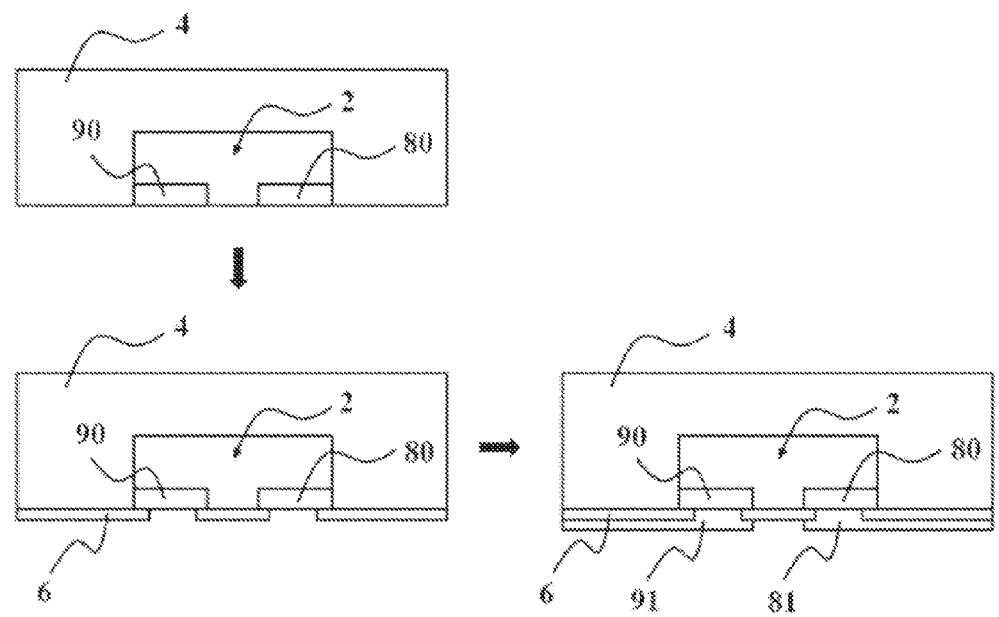
FIG. 7 is a view illustrating another example of the method for manufacturing a semiconductor device structure according to the present disclosure.

FIG. 7 is a view illustrating yet another example of the method for manufacturing a semiconductor device structure according to the present disclosure, in which after the plate 1 is removed, an insulating film 6 such as $SiO_2$ is provided, while the electrode 80 and the electrode 90 are in an exposed state. Later, the electrode 80 is connected to an external electrode 81, and an external electrode 91 is formed on the electrode 90, thereby making a structure similar to a conventional package. The external electrodes 81 and 91 can correspond to the lead frames of the conventional package. Further, it is also possible to expand the external electrodes 81 and 91 widely and to deposit them such that they can serve as reflective films. The insulating film 6 may simply have an insulation function, or it may form a stack of repeating pattern of $SiO_2/TiO_2$ or consist of a DBR to reduce absorption of by the external electrodes 81, 92. As in FIG. 4, when the semiconductor device 2 has such an insulating film 5, the insulating film 6 may be omitted. The deposition process and the photolithography process for use in the formation of both the insulating film 6 and the external electrodes 81 and 91 are common in the semiconductor chip process, and very familiar to those skilled in the art. The use of those external electrodes 81 and 91 can facilitate the mounting operation on the PCB, the COB or the like. If necessary, it is also possible to have the insulating film 6 only, without the external electrodes 81 and 91. The insulating film 6 not only protects the semiconductor device 2 and the encapsulating material 4, but it also protects the state between the encapsulating material 4 from the process of forming the external electrodes 81 and 91. Also, by forming the insulating film 6 with white materials, it is possible that the insulating film 6 could serve as a reflective film. For example, white PSR (Photo Solder Resist) may directly be used as the insulating film 6, or the insulating film 6 may be coated therewith. In one example, white PSR can be screen printed or spin coated on the insulating film, and then patterned by the photolithography process in general.

Figure 8:
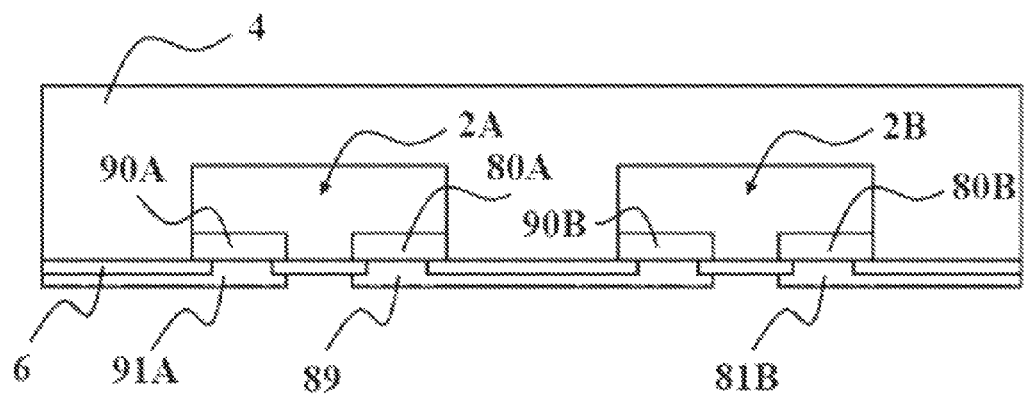
FIG. 8 is a view illustrating another example of a semiconductor device structure according to the present disclosure.

FIG. 8 is a view illustrating another example of a semiconductor device structure according to the present disclosure, in which the structure includes a semiconductor device 2A electrically connected in series with another semiconductor device 2B. This configuration can be achieved by connecting a negative electrode 80A of the semiconductor device 2A with a positive electrode 90B of the semiconductor device 2B, via an external electrode 89. Reference numeral 4 denotes an encapsulating material, reference numeral 6 denotes an insulating film, reference numeral 90A denotes a positive electrode of the semiconductor device 2A, and reference numeral 80B denotes a negative electrode of the semiconductor device 2B. This configuration makes it possible to form an electrical connection between the semiconductor devices 2A and 2B integrated through the encapsulating material 4, without necessarily using a monolithic board. In case of the monolithic board, the semiconductor devices on the board have the same structure; however, in case of the method according to the present disclosure, the semiconductor device 2A and the semiconductor device 2B are not necessarily the devices with the same functions. Needless to say, the semiconductor devices 2A and 2B can also be connected in parallel. Also, the lateral faces 4a of the encapsulating material 4 can be sloped as in FIG. 6, and this configuration enables to obtain a high-voltage semiconductor light emitting device package or semiconductor light emitting device structure, which could not be envisaged from the conventional techniques.

Figure 9:
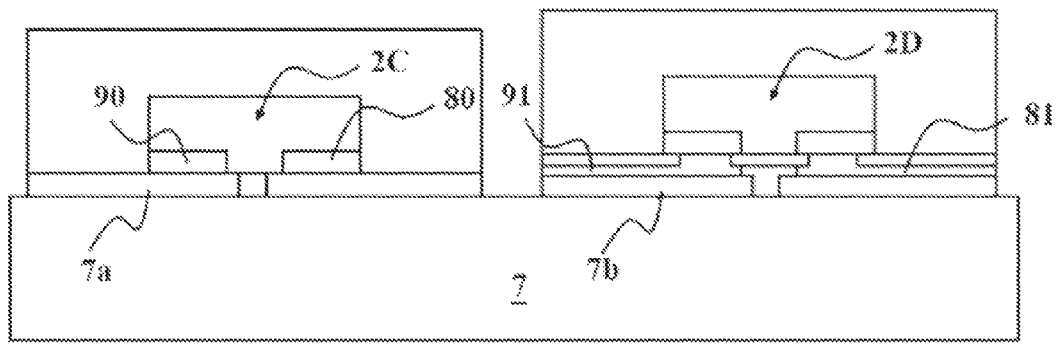
FIG. 9 is a view illustrating one example of the application of a semiconductor device structure according to the present disclosure.

FIG. 9 is a view illustrating one example of the application of a semiconductor device structure according to the present disclosure. In a semiconductor device 2C, electrodes 80 and 90 are directly connected with a wire 7A of a printed circuit board 7, while in a semiconductor device 2D, those electrode are connected with a wire 7b through external electrodes 81 and 91. The printed circuit board 7 can be a flexible circuit board.

Figure 10:
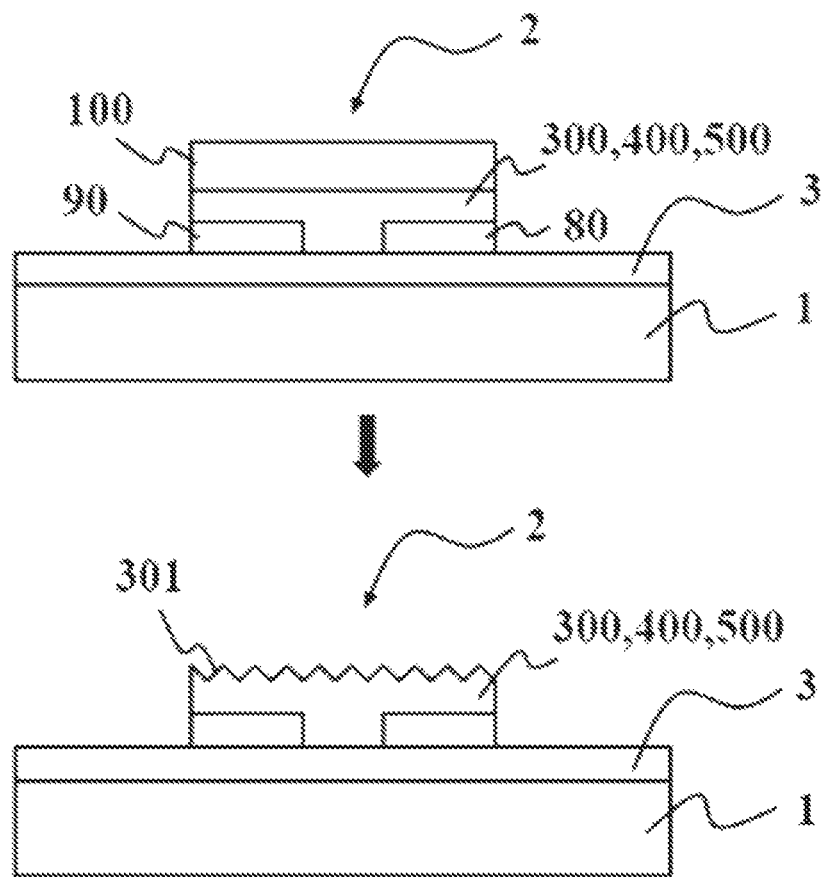
FIG. 10 is a view illustrating another example of the method for manufacturing a semiconductor device structure according to the present disclosure.

FIG. 10 is a view illustrating yet another example of the method for manufacturing a semiconductor device structure according to the present disclosure, in which the structure includes a semiconductor device 2 similar to one shown in FIG. 2. The semiconductor device 2 includes a substrate 100, and a first semiconductor layer 300 having a first conductivity, an active layer 400 for generating light via electron-hole recombination and a second semiconductor layer 500 having a second conductivity different from the first conductivity, which are grown on the substrate 100, and additionally electrodes 80 and 90 are formed. The semiconductor device 2 is attached to a plate 1 using an adhesive 3, and then covered with an encapsulating material 4. Preferably, once the substrate 100 is removed, an uneven surface 301 is formed in order to increase light extraction efficiency. The procedure after this stays the same. The substrate 100 can be removed by a laser lift-off process for example, and the uneven surface 301 can be obtained by dry etching such as ICP (Inductively Coupled Plasma). This enables a chip-level laser lift-off.

Figure 11:
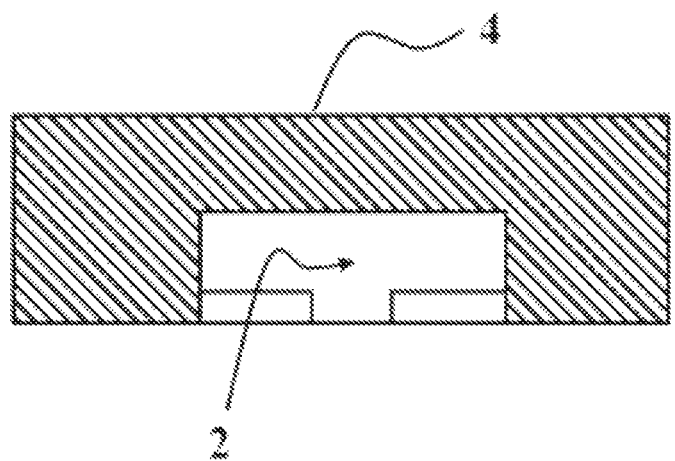
FIG. 11 is a view illustrating yet another example of a semiconductor device structure according to the present disclosure.

FIG. 11 is a view illustrating yet another example of a semiconductor device structure according to the present disclosure, in which the encapsulating material 4 contains a phosphor. Any light of a desired color can be emitted by using YAG, silicate or nitride-based phosphors.

Figure 12:
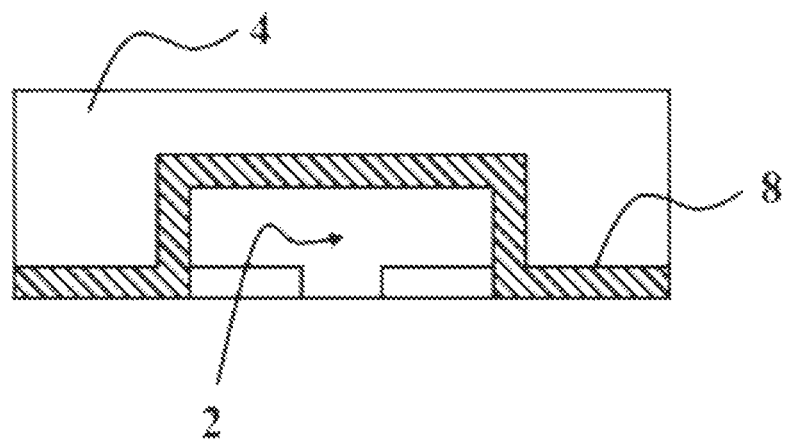
FIG. 12 is a view illustrating yet another example of a semiconductor device structure according to the present disclosure.

FIG. 12 is a view illustrating yet another example of a semiconductor device structure according to the present disclosure, in which a phosphor layer 8 is formed either inside the encapsulating material 4 or at the bottom of the encapsulating material 4. Apart from this, it is also possible to form the phosphor layer 8 on top of the encapsulating material 4. This can be achieved by precipitating the phosphor inside the encapsulating material 4, or by spin coating the encapsulating material 4 separately, or by coating the encapsulating material 4 with the phosphor contained in a volatile liquid and then volatilizing the liquid, thereby leaving only the phosphor to cover the encapsulating material 4. If appropriate, a plurality of phosphor layers 8 can be formed.

Figure 13:
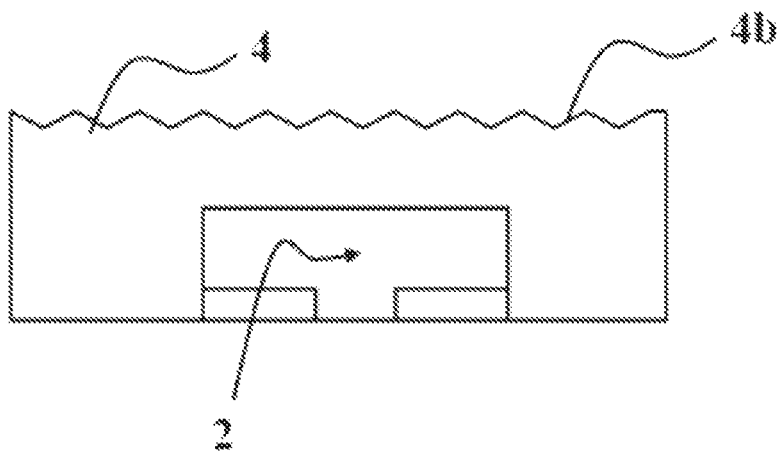
FIG. 13 is a view illustrating yet another example of a semiconductor device structure according to the present disclosure.

FIG. 13 is a view illustrating yet another example of a semiconductor device structure according to the present disclosure, in which the encapsulating material 4 has an uneven surface or irregularities 4g on the surface thereof, so as to increase light extraction efficiency. This uneven surface 4g can be formed by molding, such as pressing, nanoimprinting or the like. It can also be formed by coating the encapsulating material 4 with a bead material, followed by performing an etching or sandblasting operation for example. Generally the uneven surface 4g can be formed before or after the separation of the plate 1.

Figure 14:
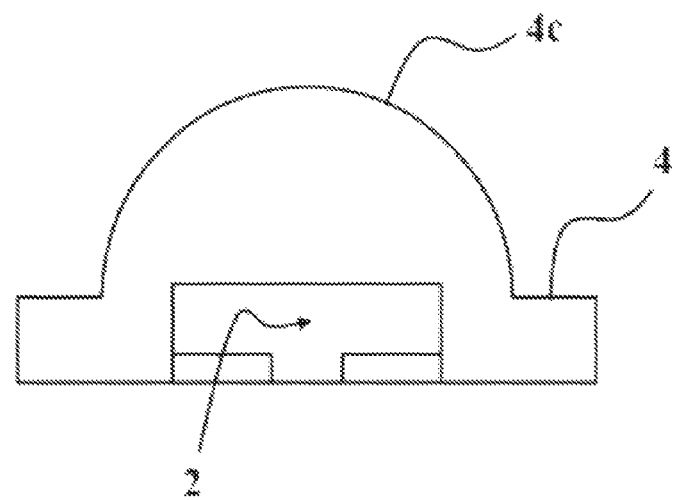
FIG. 14 is a view illustrating yet another example of a semiconductor device structure according to the present disclosure.

FIG. 14 is a view illustrating still another example of a semiconductor device structure according to the present disclosure, in which a lens 4c is formed on the encapsulating material 4. Preferably, the lens 4c is integrally formed with the encapsulating material 4. Such an integrated lens 4c can be obtained by compression molding, for example.

Figure 16:
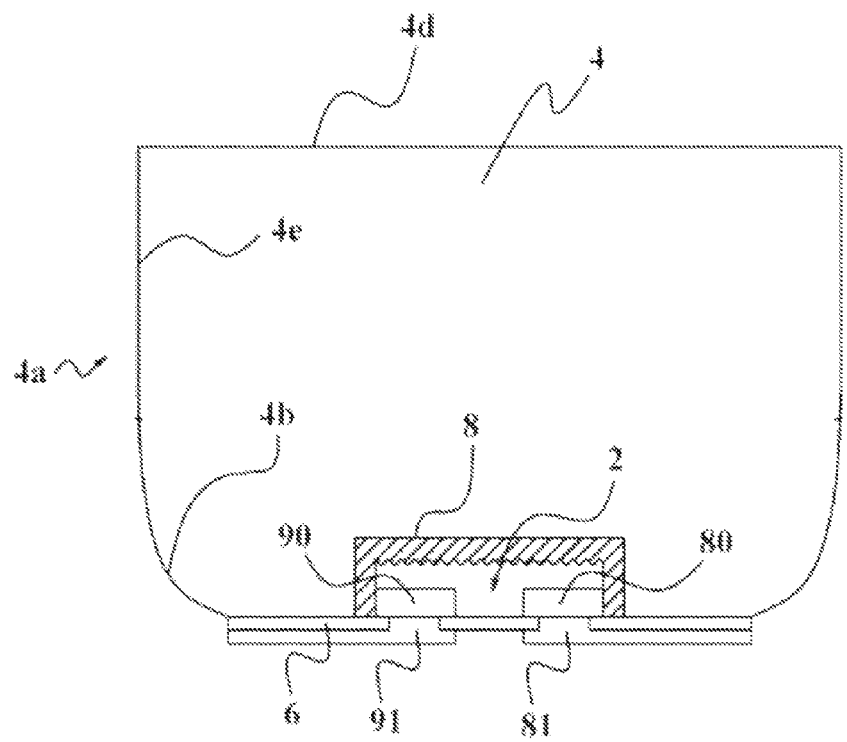
FIG. 16 is a view illustrating yet another example of a semiconductor device structure according to the present disclosure.
Figure 18:
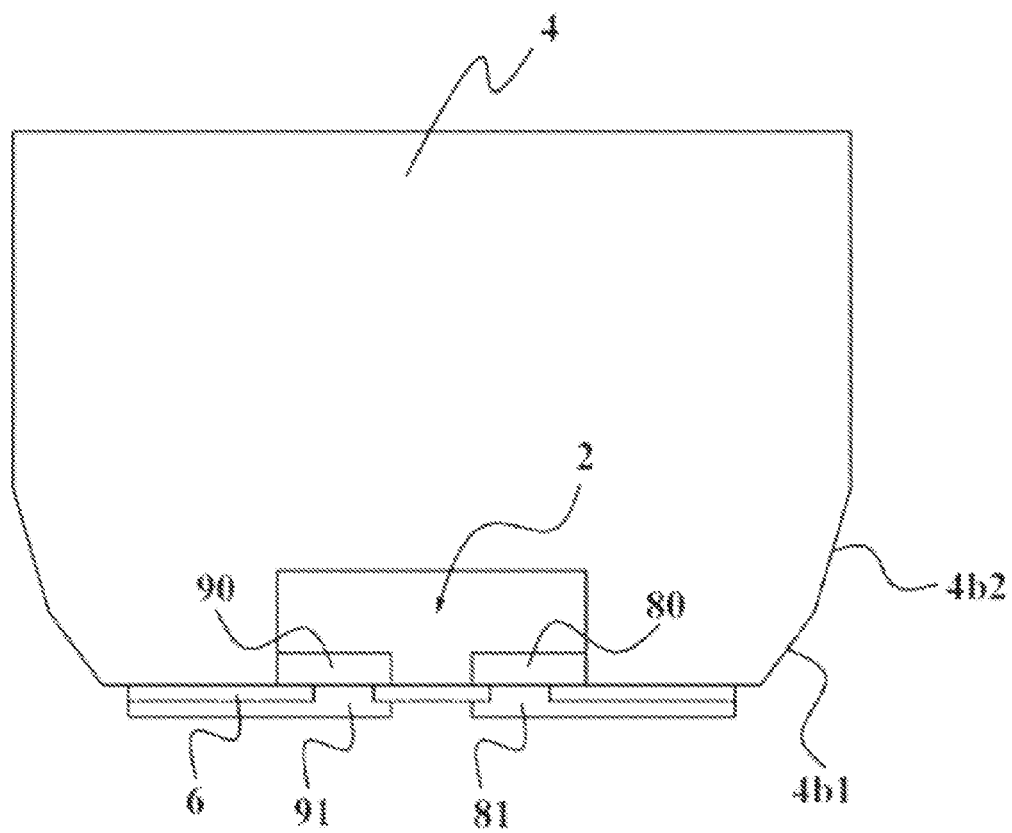
FIG. 18 and FIG. 19 are views illustrating examples of a reflector according to the present disclosure.
Figure 19:
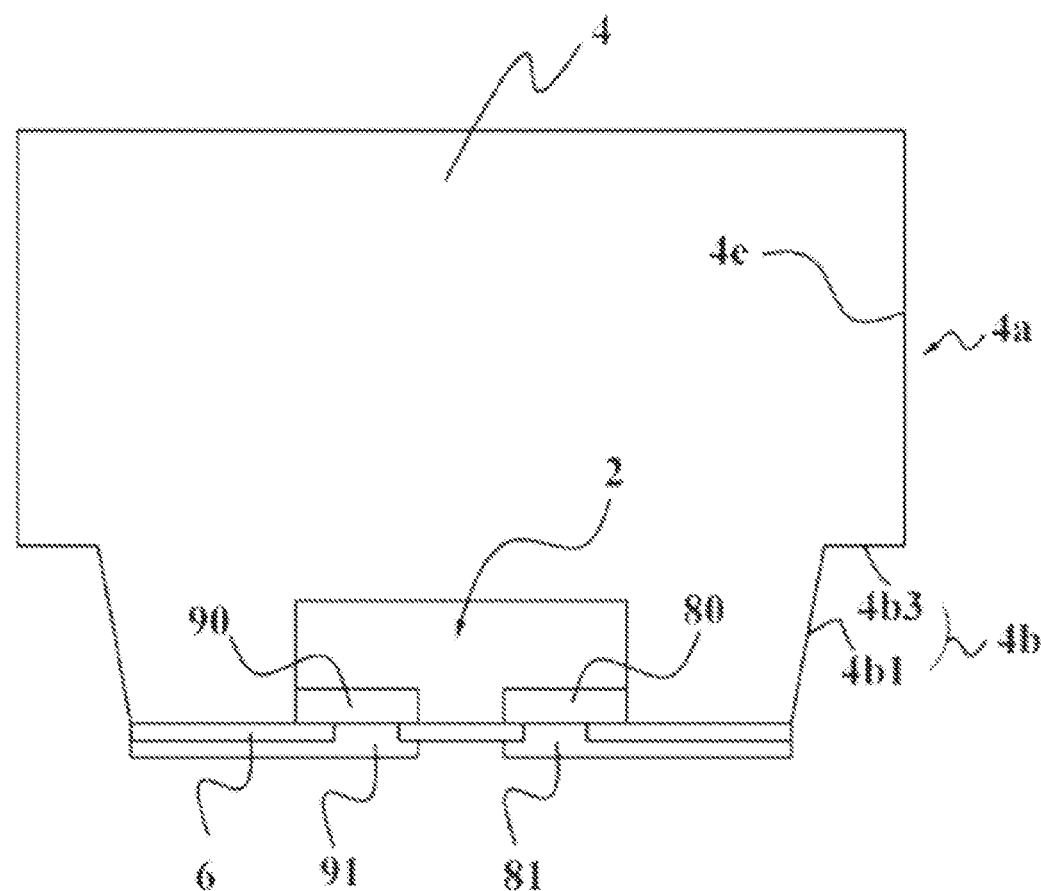

FIG. 16 is a view illustrating still another example of a semiconductor device structure according to the present disclosure, in which the semiconductor device 2 is a flip chip type semiconductor light emitting device as shown in FIG. 4, and the lateral faces 4a of the encapsulating material 4 have light reflector 4b for reflecting the light generated in the active layer 400 (see FIG. 2) upward. The light reflector 4b can be formed entirely or partially on the lateral face 4a. It is preferably formed on the bottom of the lateral face 4a where the semiconductor device 2 is located. Referring to FIG. 16, the upper portion 4e of the lateral face 4a, free of the light reflector 4b, preferably has a certain level of height. The upper portion 4e may be formed in the vertical direction with respect to the flat top face 4d. One example of its entire configuration is shown in FIG. 22. As the upper portion 4e has a certain level of height, the semiconductor device structure may be used as a light source of a beam projection, without an additional lens. FIG. 16 illustrates the light reflector 4b in a curved shape, while FIG. 18 and FIG. 19 illustrate other examples of the light reflector 4b. That is, FIG. 18 shows that two linear faces 4b1 and 4b2 with two different angles of inclination form a reflector. FIG. 19 shows that the lateral face 4a has an inclined face 4b1 and a step 4b3 thereon. The inclined face 4b1 and the step 4b3 can be incorporated in multiple times. The operation principles of the reflector 4b will be described with reference to FIG. 20 and FIG. 21 later. Indeed, the lateral face 4a shown in FIG. 6 can be regarded as a reflector. Any description of the same reference numerals will not be repeated. Here, the phosphor 8 is not absolutely required. It can be conformally coated over the encapsulating material as in FIG. 16, or it can be provided to all or part of the encapsulating material 4 as in FIG. 11. In case that the insulating film 6 and the external electrodes 81 and 91 are available, they are formed on the front face of the encapsulating material 4 where the electrodes 80 and 90 are located and can be removed subsequently in a sawing process by a blade 41 described below, or they may be omitted in a region where the light reflector 4b is already formed.

Figure 17:
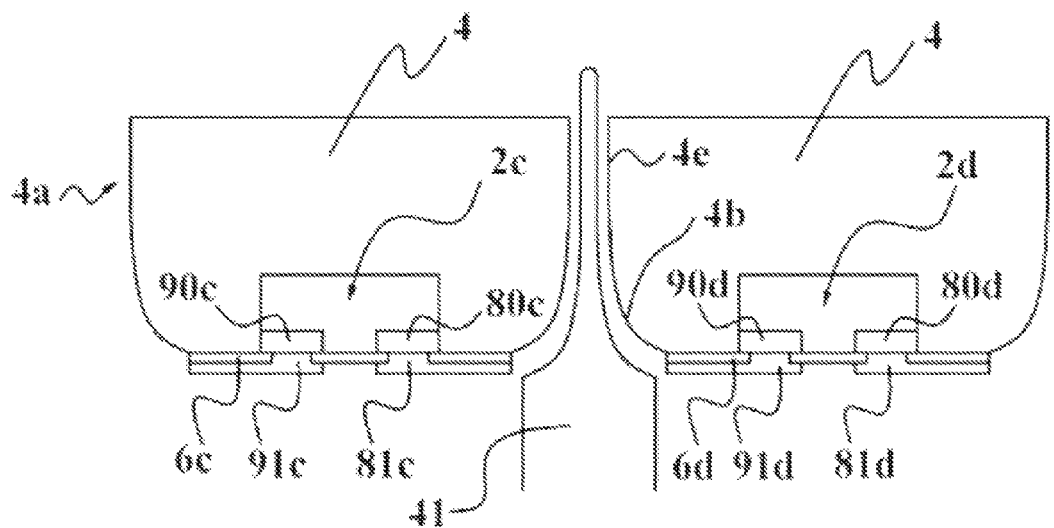
FIG. 17 is a view illustrating one example of the method for manufacturing the semiconductor device structure shown in FIG. 16.

FIG. 17 is a view illustrating one example of the method for manufacturing the semiconductor device structure shown in FIG. 16. This method is basically identical with the procedure described in FIG. 4 to FIG. 6, except that in the process of separating the semiconductor devices 2C and 2D or forming the lateral faces 4a, it is possible to separate the semiconductor device 2 and to form the lateral faces 4a at the same time, by employing a saw blade 41 having a shape corresponding to the upper portion 4e of the light reflector 4b. For instance, those inclined faces 4b1 and 4b2 shown in FIG. 18 can be formed by employing a blade capable of creating two different angles, while the inclined face 4b1 and the step 4b3 shown in FIG. 19 can be formed by employing one blade having a shape corresponding to the inclined face 4b1 and another blade having a shape corresponding to the step 4b3. The application of a mechanical processing such as sawing is also advantageous in that the lateral faces 4a or the light reflector 4b can be precisely formed into their desired shapes. Although this is almost impossible when, as in FIG. 15, the encapsulating material 170 is dispensed by controlling its contour shape to the extent of μm or greater (e.g., in case of dispensing the encapsulating material in the COB), the same task is facilitated by applying the method according to the present disclosure. Also, in a conventional package, a mold is usually required to obtain such a shape of the lens 4c as in FIG. 14. However, with the application of the method according to the present disclosure, the light reflector 4b can be formed without the help of such a mold.

A suitable height for the p-side finger electrodes 93 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Figure 20:
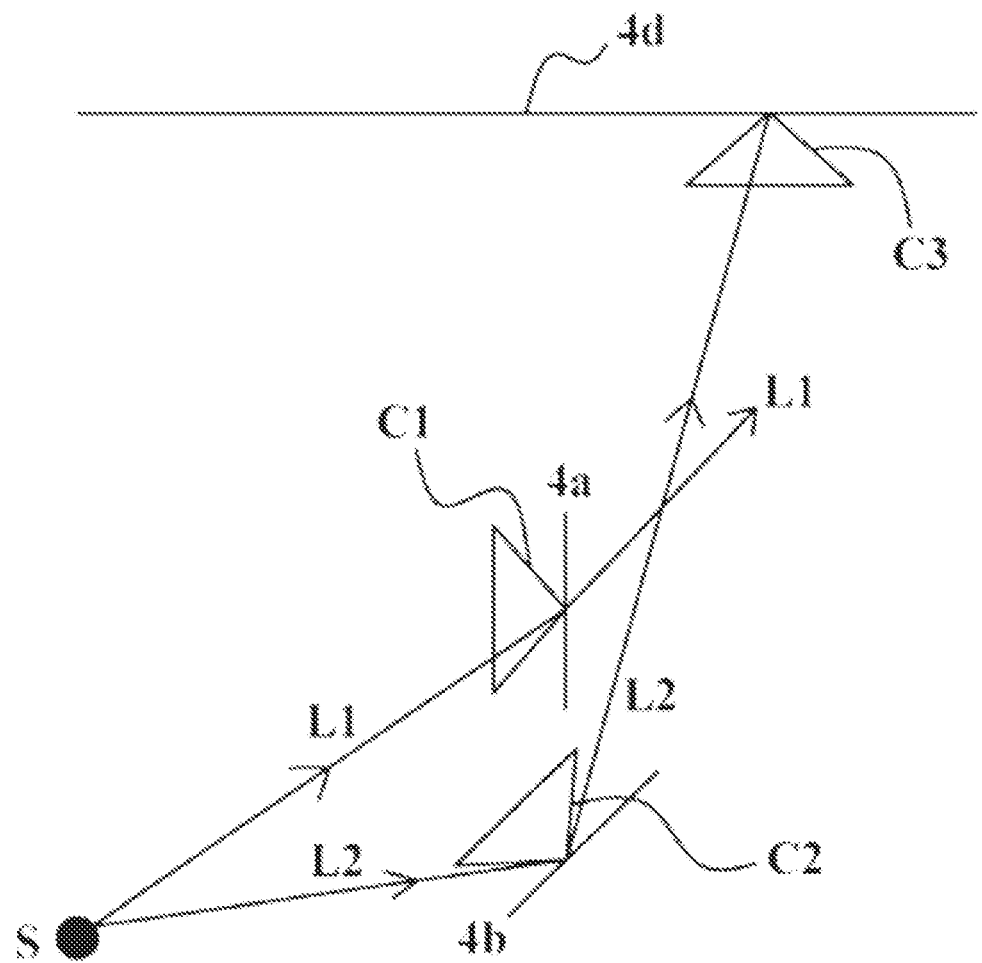
FIG. 20 and FIG. 21 are views describing the principles of forming a reflector according to the present disclosure.
Figure 21:
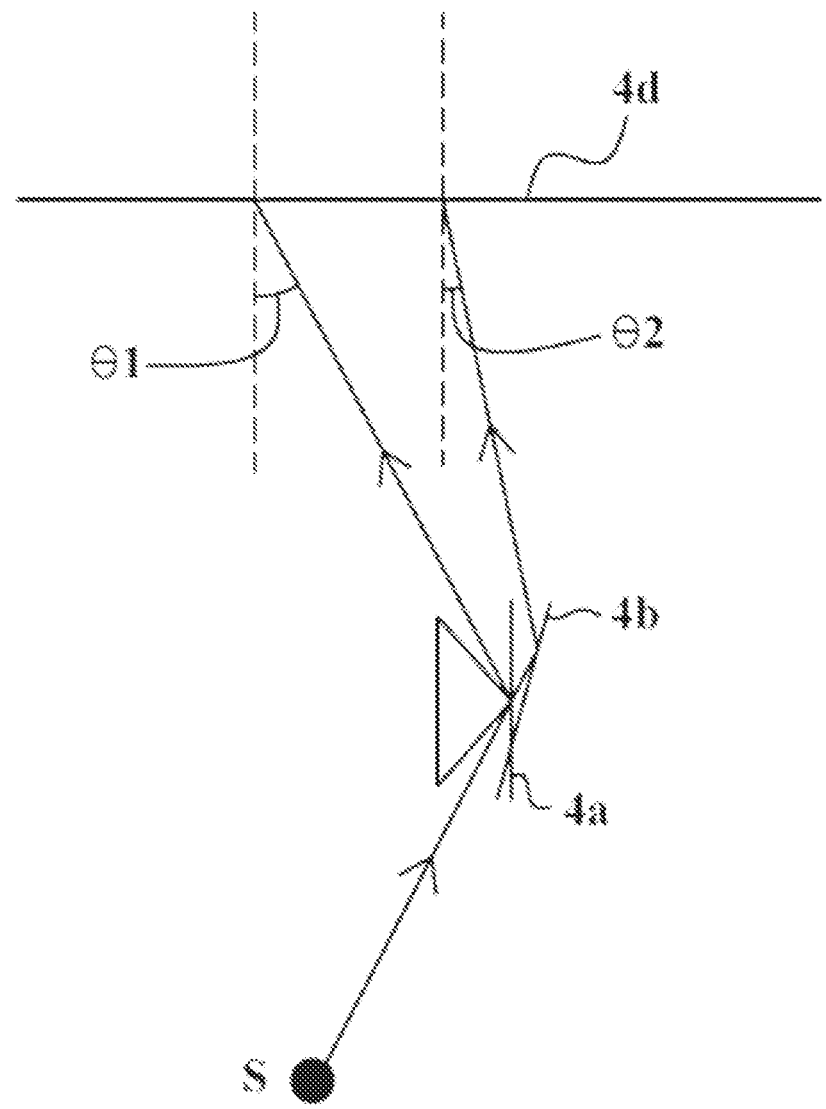
Figure 22:
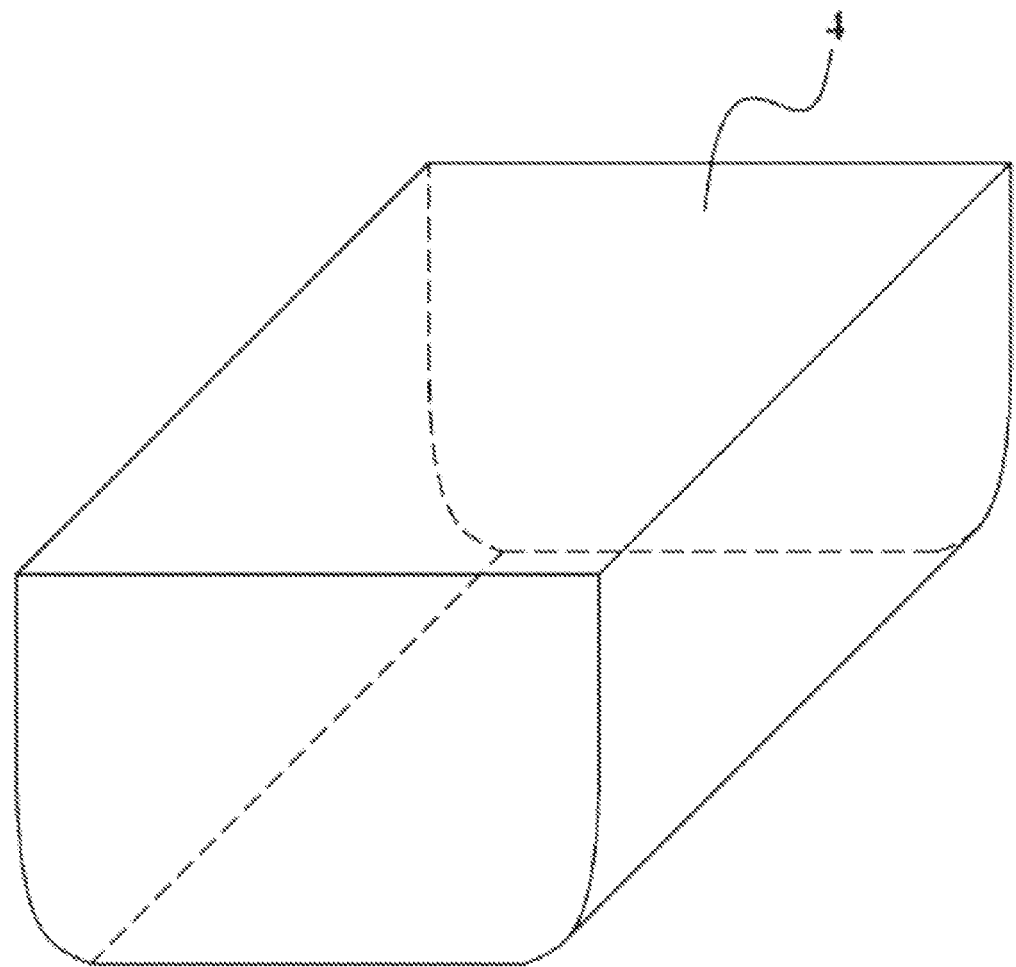
FIG. 22 is a view illustrating one example of the overall configuration of an encapsulating material according to the present disclosure.

FIG. 20 and FIG. 21 are views describing the principles of forming a reflector according to the present disclosure. Here, when light L1 from a light source S is incident on the vertical lateral face 4a, in particular when the light L1 enters into a triangle C1 indicating a critical angle, it passes the lateral face 4a at right angles with the boundary between a medium having a high refractive index (e.g. the encapsulating material 4) and a medium having a low refractive index (e.g. air) and travels into the medium having a low refractive index. However, when the light L1 has a large angle of incidence, it is reflected from the vertical lateral face 4a upward, and is therefore subjected to the same principles on the top face 4d. Meanwhile, in case that the light reflector 4b is inclined to the right with respect to the vertical lateral face 4a, the angle of incidence with respect to the vertical side 4a becomes even smaller such that even the light L2 entering into the triangle C1 may not enter into the triangle C2, and reflects the light L2 towards the top face 4D. When the light reflector 4b is curved, the same principles are applied to a line tangent to each point in the light reflector 4b. Under this application, the light reflector 4b can be formed into a linear, parabola or arc shape, and if possible in the manufacturing process, it can have a combined shape of them. Preferably, the light reflector 4b may be formed such that every light incident on the light reflector 4b can be reflected towards the top face 4d, but this is not absolutely required. More preferably, the light reflector 4b is designed such that the light L2 reflected from the light reflector 4b can enter into the triangle C3 of the top face 4d. Such a design is already a well-known technology to those skilled people in the optical field. On can see from FIG. 21 that, for a certain light L, the angle of incidence $\theta_1$ when the light L is reflected from the vertical lateral face 4a towards the top face 4d is smaller than the angle of incidence $\theta_2$ when the light L is reflected from the light reflector 4b towards the top face 4d. It is understood that the angle of incidence should be smaller in order to increase the light emission probability through the top face 4d.

Figure 15:
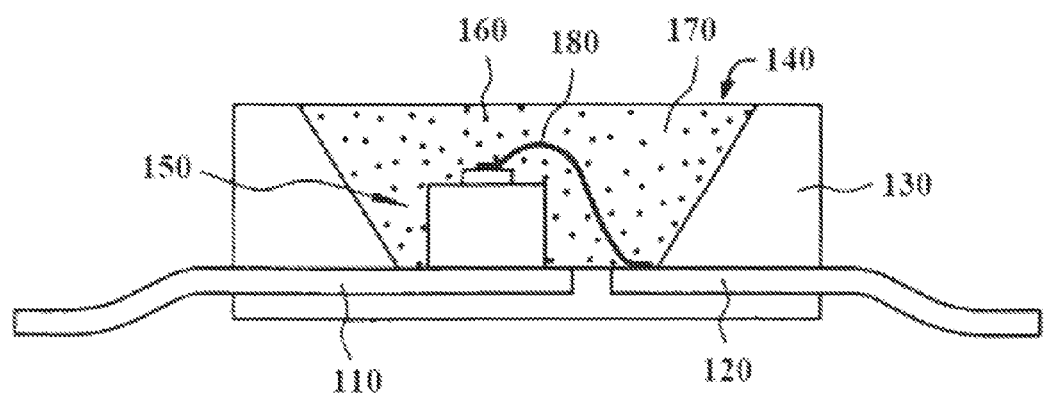
FIG. 15 is a view illustrating one example of the semiconductor light emitting package or the semiconductor light emitting device structure in the prior art.

When the semiconductor device 2 is a light emitting device, it preferably has a light reflector 4b and/or a white insulating film 6 such that the light extraction efficiency upward the top face 4d or the semiconductor device 2 can be greatly increased. Likewise, even in the prior art as shown in FIG. 15, a white mold 130 is used, which composes the overall configuration of a package and provides a cavity 140, while reflecting light in the cavity 140. In the present disclosure, however, the aforementioned white mold 130 is replaced with the light reflector 4b for reflecting light (using a difference in refractive index between the encapsulating material 4b and outside), and the white insulating film 6 in the disclosure is distinguished from the white mold 13 in terms of its location and functions. Moreover, the application of the light reflector 4b and the white insulating film 6 is due to a particular system of the manufacturing method according to the present disclosure.

Figure 23:
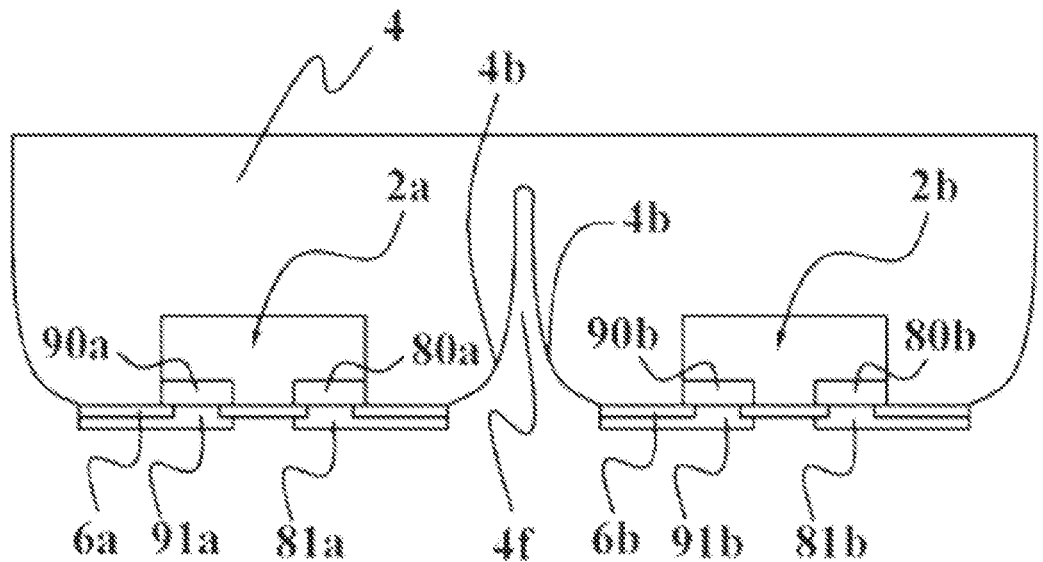
FIG. 23 is a view illustrating yet another example of a semiconductor device structure according to the present disclosure.

FIG. 23 is a view illustrating yet another example of a semiconductor device structure according to the present disclosure, in which a semiconductor device 2a and a secondary semiconductor device 2b are integrally formed by the encapsulating material 4. There is a groove 4f between the semiconductor device 2a and the secondary semiconductor device 2b, and the groove 4f can take any shape, including a slit for example. The groove 4f acts as a divider between the semiconductor device 2a and the secondary semiconductor device 2b, yet in such a way that these two semiconductor devices are integrally formed. It can also be used for preventing any unnecessary interference between the functions of the semiconductor device 2a and secondary semiconductor device 2b. It is not essential that the semiconductor device 2a has the same functions as the secondary semiconductor device 2b. For instance, one of them can be a functional device, and the other can be a Zener diode for preventing the static electricity. When both the semiconductor device 2a and the secondary semiconductor device 2b are light emitting devices, each of the semiconductor device 2a and secondary semiconductor device 2b can, of course, emit lights of different colors from each other. When both the semiconductor device 2a and the secondary semiconductor device 2b are light emitting devices, the groove 4f is involved in the formation of a light reflector 4b. With the groove 4f being formed as the light reflector 4b, the semiconductor device 2a and the secondary semiconductor device 2b are able to emit light towards the respective top faces 4d, without experiencing any interference with each other. This groove 4f can be obtained by employing a blade having a depth less than that of the entire length of the encapsulating material 4. It is also acceptable that the light reflector 4b is formed on only one of the semiconductor devices 2a and 2b.

Figure 24:
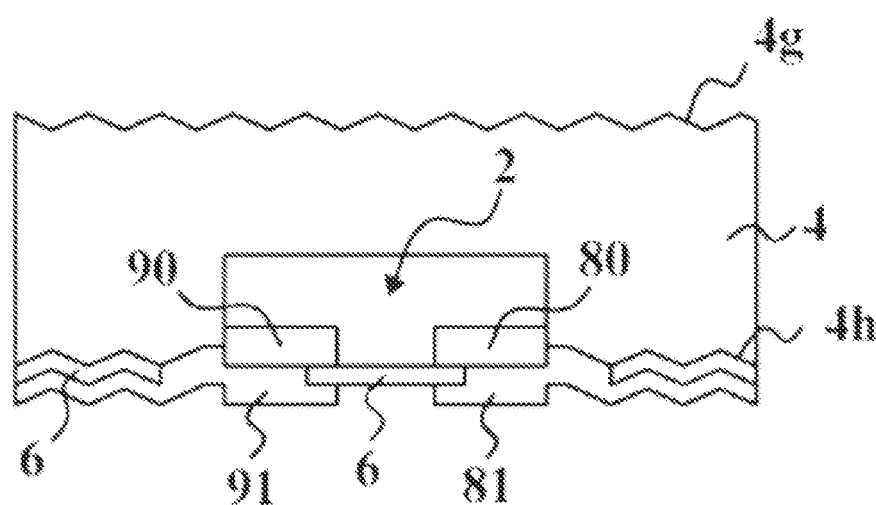
FIG. 24 is a view illustrating yet another example of a semiconductor device structure according to the present disclosure.

FIG. 24 is a view illustrating yet another example of a semiconductor device structure according to the present disclosure, in which the encapsulating material has an uneven surface or irregularities 4g on top thereof, and also an uneven surface or irregularities 4h at the bottom thereof where electrodes 80 and 90 of the semiconductor device 2 are located. Naturally, it is possible that the irregularities 4g are formed on only one side. When the semiconductor device 2 is a semiconductor light emitting device, the irregularities 4g can serve as a scattering plane for scattering light. The presence of the irregularities 4h enables to expand an area which the encapsulating material 4, the insulating film 6 and/or the external electrodes 81 and 91 are facing, and as a result thereof, the bonding strength between them can be improved. Further, the bonding strength in the lateral direction can also be improved as the movement in the lateral direction is restricted by the irregularities 4h.

Figure 25:
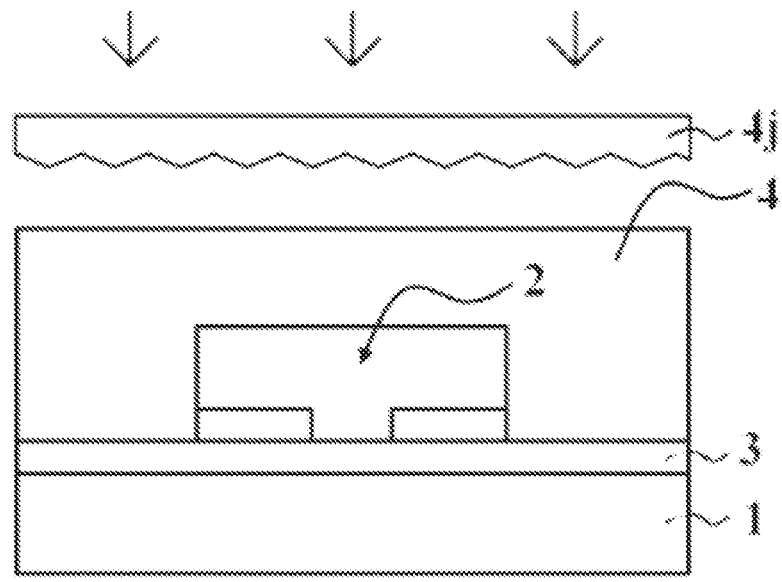
FIG. 25 is a view illustrating one example of the method for manufacturing the semiconductor device structure shown in FIG. 24.

FIG. 25 is a view illustrating one example of the method for manufacturing the semiconductor device structure shown in FIG. 24. In particular, it illustrates a process of forming irregularities 4g (see FIG. 24) on the encapsulating material 4 by employing a press plate 4j, while the semiconductor device 2 is being secured at a position on the plate 1.

Figure 26:
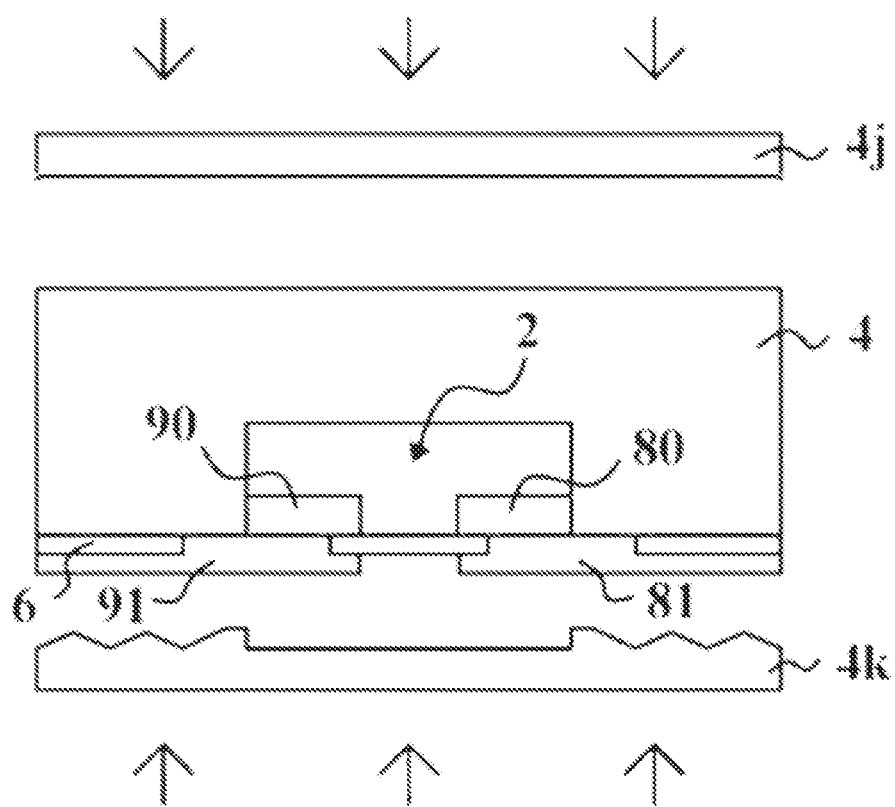
FIG. 26 is a view illustrating another example of the method for manufacturing the semiconductor device structure shown in FIG. 24.

FIG. 26 is a view illustrating another example of the method for manufacturing the semiconductor device structure shown in FIG. 24. In particular, it illustrates a process of forming irregularities 4h (see FIG. 24) by employing a press plate 4k, after the insulating film 6 and the external electrodes 81 and 91 are formed on the semiconductor device 2. In this example, the press plate 4k can be planar as shown in FIG. 26 or can have irregularities as shown in FIG. 25. It can also be envisaged that the press plate 4k is placed on top of the encapsulating material 4, and the press plate 4j being planar or uneven can be plated at the bottom of the encapsulating material 4.

Figure 27:
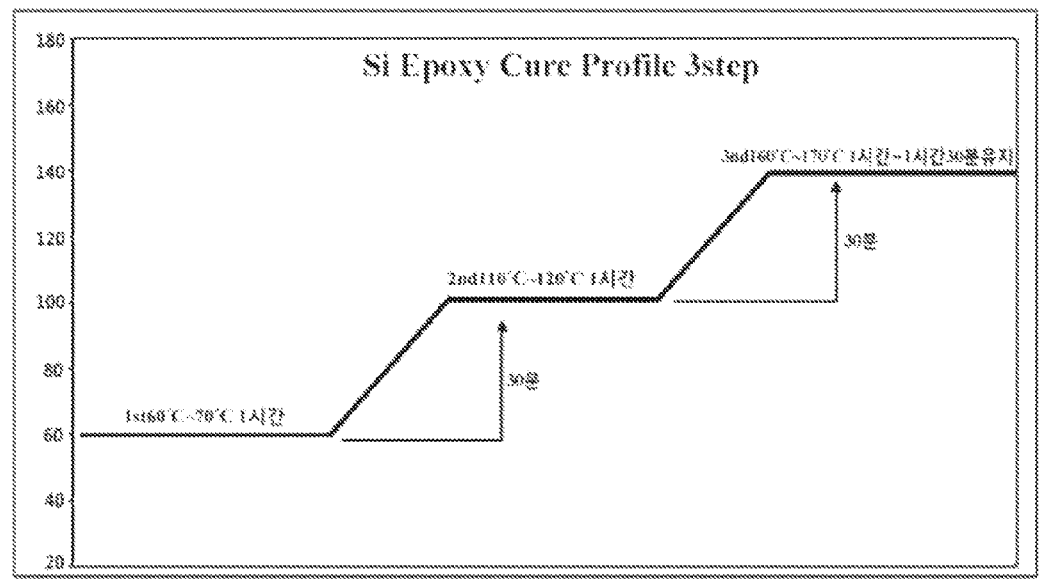
FIG. 27 is a view illustrating one example of the curing operation of an encapsulating material in the process of manufacturing the semiconductor device structure shown in FIG. 24.

FIG. 27 is a view illustrating one example of the curing operation of an encapsulating material in the process of manufacturing the semiconductor device structure shown in FIG. 24. When the encapsulating material 4 is a thermosetting resin (e.g. a silicone epoxy resin), it is desirable that the irregularities 4g, 4h are formed before the curing operation is completed because it is not easy to form the irregularities once the curing operation is completed. In addition, by allowing the curing operation to be completed during the formation of those irregularities 4g, 4h, it is possible to have the irregularities 4g, 4h follow the shapes of the press plates 4h, 4k exactly. For example, it is possible to form the irregularities 4g, 4h, when the encapsulating material 4 is at a temperature equal to or above its glass transition temperature. If the curing operation proceeds at a very high temperature at once, waves or bubbles may occur on the encapsulating material 4, and thus a clear smooth surface cannot be attained. To resolve this issue, it has been found that the encapsulating material 4 can have a clear smooth surface, if the temperature is slowly increased step by step.

Figure 28:
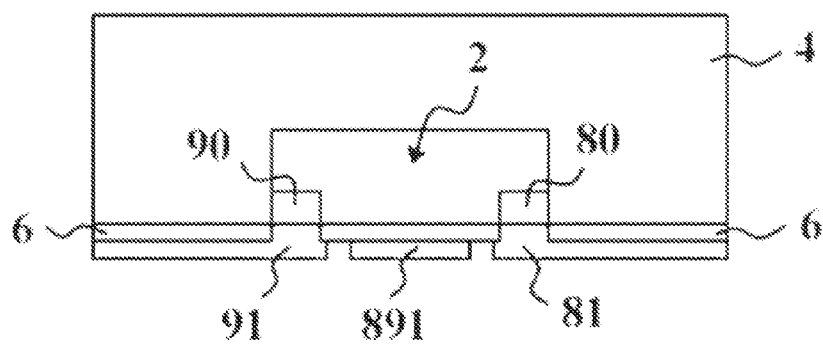
FIG. 28 is a view illustrating yet another example of a semiconductor device structure according to the present disclosure.

FIG. 28 is a view illustrating yet another example of a semiconductor device structure according to the present disclosure, in which at the opposite side of the covered semiconductor device 2 with the encapsulating material 4, a heat-dissipation pad 891 is provided for dissipating heat generated from the semiconductor device 2 outside, thereby producing an electrical insulation from the electrodes 80 and 90 or from both the electrodes 80 and 90 and the external electrodes 81 and 91. In this example, the insulating film 6 is formed first, and then the heat-dissipation pad 891 is formed on the insulating film 6. With this configuration, a path for supplying electricity and a path for dissipating heat outside are independent of each other, such that the efficiency of heat dissipation can be increased. Preferably, the heat-dissipation pad 891 is also deposited together, when the external electrodes 81 and 91 are deposited.

Figure 29:
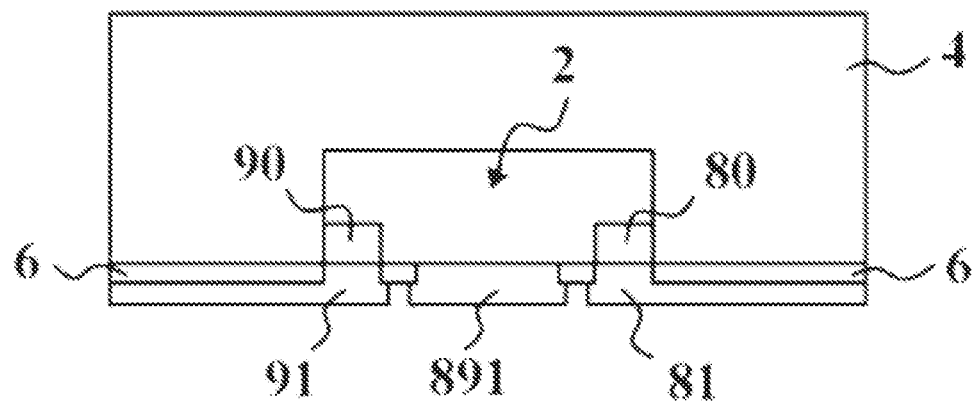
FIG. 29 is a view illustrating yet another example of a semiconductor device structure according to the present disclosure.

FIG. 29 is a view illustrating yet another example of a semiconductor device structure according to the present disclosure. This semiconductor device structure is identical with one shown in FIG. 28 in that the insulating film 6 is formed first, followed by the external electrodes 81 and 91 and the heat-dissipation pad 891, but it is different in that a part of the insulating film 6 is removed to enable a direct contact between the heat-dissipation pad 891 and the semiconductor device 2. With this configuration, the efficiency of heat dissipation can be increased, as compared with the case where the insulating film 6 mainly composed of a dielectric material is interposed.

Figure 30:
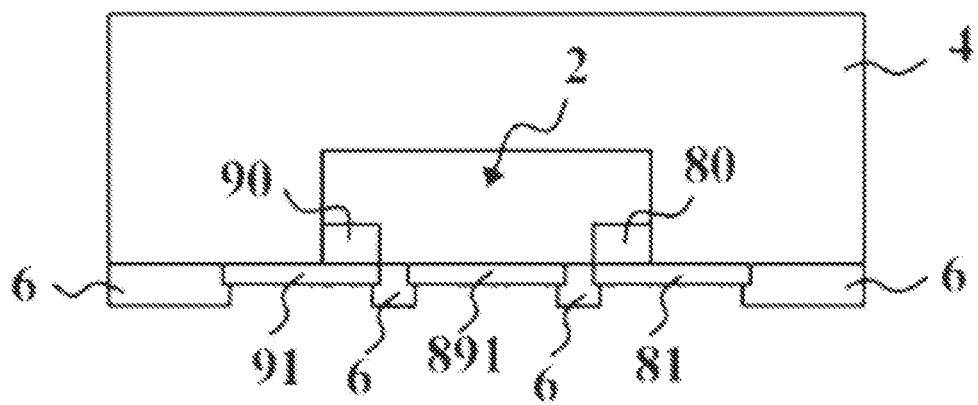
FIG. 30 is a view illustrating yet another example of a semiconductor device structure according to the present disclosure.

FIG. 30 is a view illustrating yet another example of a semiconductor device structure according to the present disclosure, in which the external electrodes 81 and 91 and the heat-dissipation pad 891 are formed first, and then the insulating film 6 is formed for electrically insulating the external electrodes 91 and 91 and the heat-dissipation pad 891.

Figure 31:
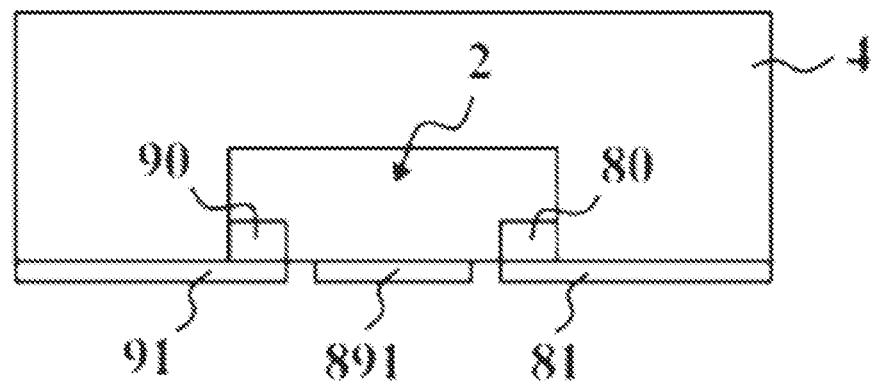
FIG. 31 is a view illustrating yet another example of a semiconductor device structure according to the present disclosure.

FIG. 31 is a view illustrating yet another example of a semiconductor device structure according to the present disclosure, in which the external electrodes 81 and 91 and the heat-dissipation pad 891 are formed, yet the insulating film 6 is absent.

Figure 32:
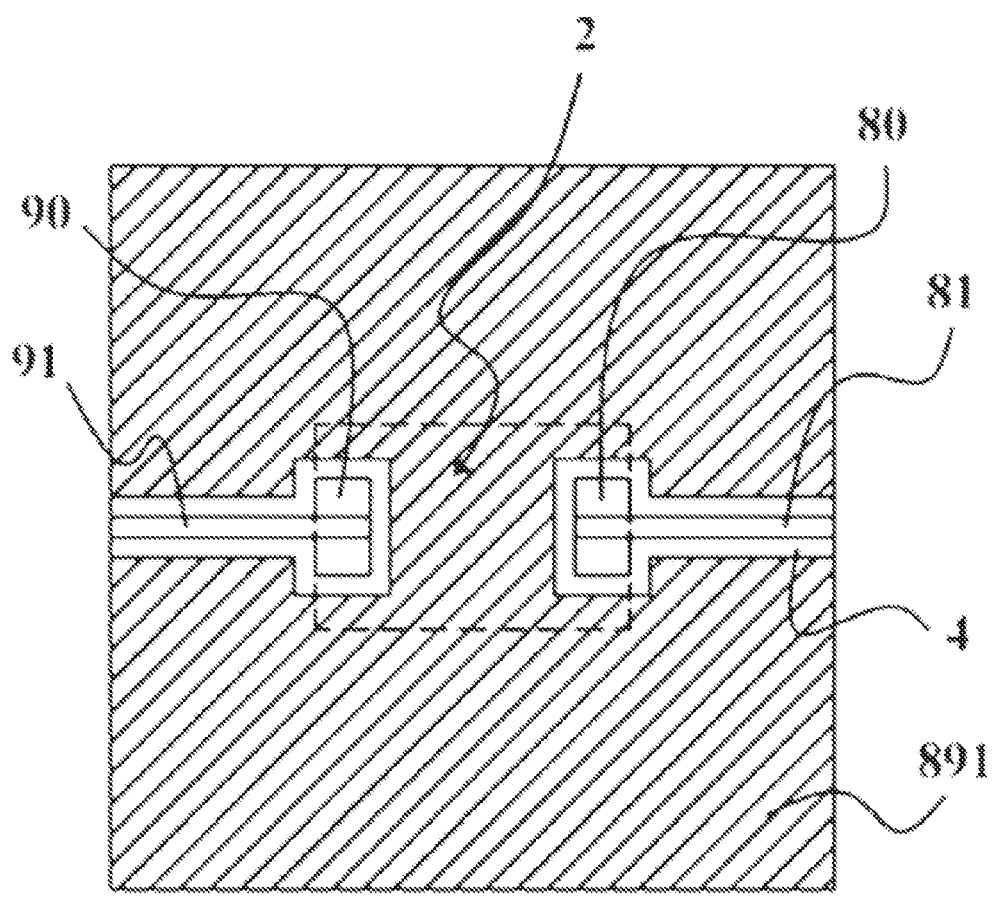
FIG. 32 is a view illustrating one example of the array of electrodes, external extrudes and a heat-dissipation pad, as seen from the bottom of the semiconductor device structure shown in FIG. 31.

FIG. 32 is a view illustrating one example of the array of electrodes, external extrudes and a heat-dissipation pad, as seen from the bottom of the semiconductor device structure shown in FIG. 31. In this example, the semiconductor device 2 surrounded with the encapsulating material 4 is located at the center; the electrode 80 and the electrode 90 are provided with the external electrode 81 and the external electrode 91 array, respectively; and the heat-dissipation pad 891 is formed across the entire region except those mentioned above. With this configuration, the contact area with the PCB, the COB or the like, on which the semiconductor device structure is mounted, can be expanded, and as a result thereof, heat dissipation of the semiconductor device structure can be maximized. The heat-dissipation pad 891 is preferably formed across almost the entire semiconductor device 2 and encapsulating material 4, but this is not absolutely required. If necessary, the heat-dissipation pad 891 can be formed across all or part of the semiconductor device 2, and formed across all or part of the encapsulating material 4.

Figure 33:
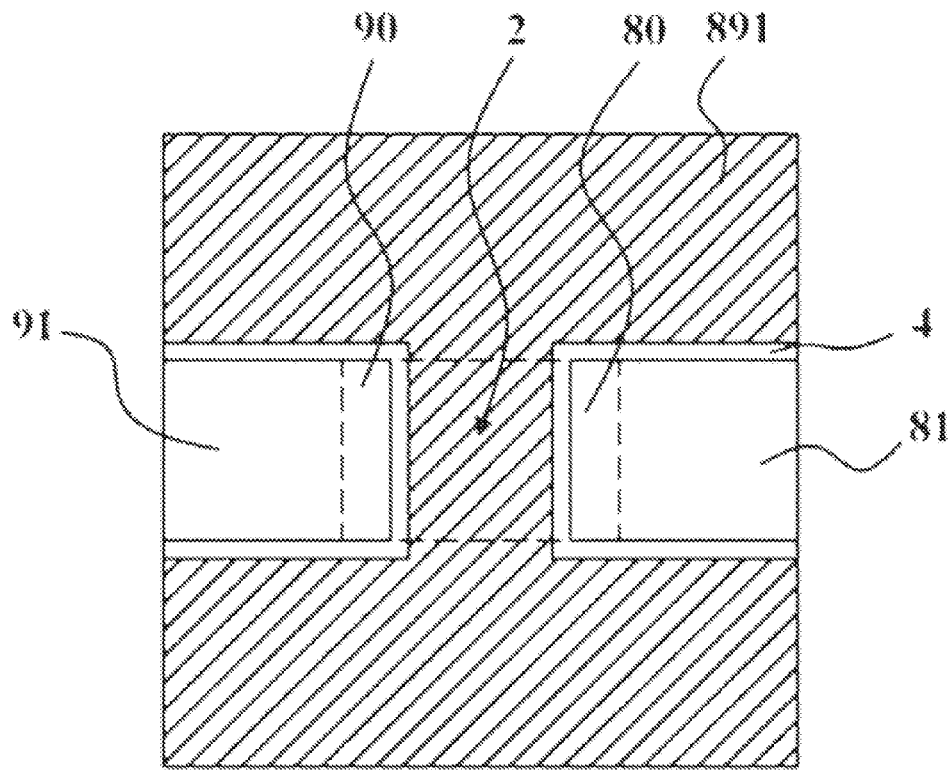
FIG. 33 is a view illustrating another example of the array of electrodes, external extrudes and a heat-dissipation pad, as seen from the bottom of the semiconductor device structure shown in FIG. 31.

FIG. 33 is a view illustrating another example of the array of electrodes, external extrudes and a heat-dissipation pad, as seen from the bottom of the semiconductor device structure shown in FIG. 31. In this example, the electrodes 80 and 90 and the external electrodes 81 and 91 are formed in larger dimensions than those in the semiconductor device structure shown in FIG. 32, such that some of the heat may be dissipated, via from the semiconductor device 2, then the electrodes 80 and 90 and the external electrodes 81 and 91. This configuration can be particularly suitable when the semiconductor device is a flip chip type semiconductor light emitting device in which one of the electrodes 80 and 90 is designed in larger dimensions to serve as a reflector. Meanwhile, the heat-dissipation pad 891 not only has a heat-dissipation function, but also serves as a light reflective film when the semiconductor device is a semiconductor light emitting device. Here, the heat-dissipation pad 891 preferably consists of a metal, such as Al or Au, which is known to be excellent in terms of heat dissipation and reflectivity. Preferably, as shown in FIG. 29 and FIG. 30, the opposite side of the covered semiconductor device 2 with the encapsulating material 4 is completely covered with the heat-dissipation pad 891, the external electrodes 81 and 91 and the insulating film 6 (e.g., white PSR, DBR), thereby maximizing the efficiency of light reflection.

Figure 34:
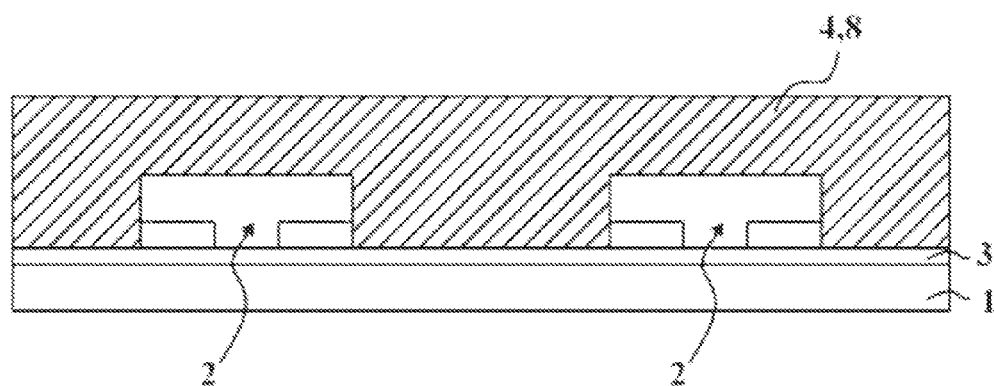
FIG. 34 to FIG. 36 are views illustrating one example of the method for manufacturing the semiconductor device structure shown in FIG. 11.
Figure 35:
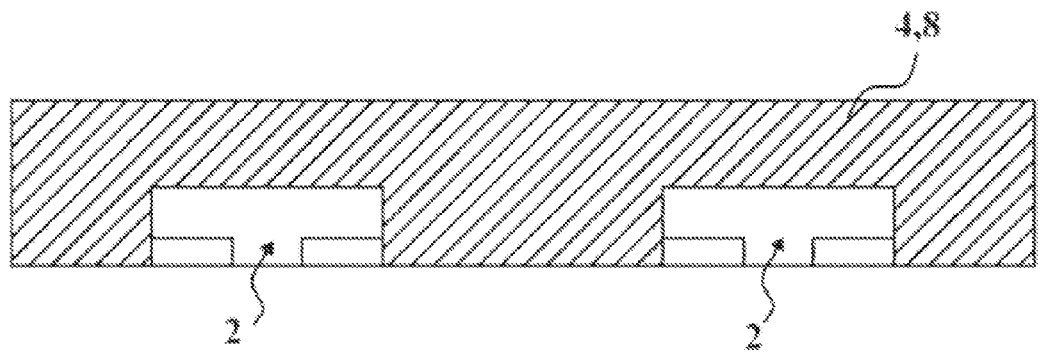
Figure 36:
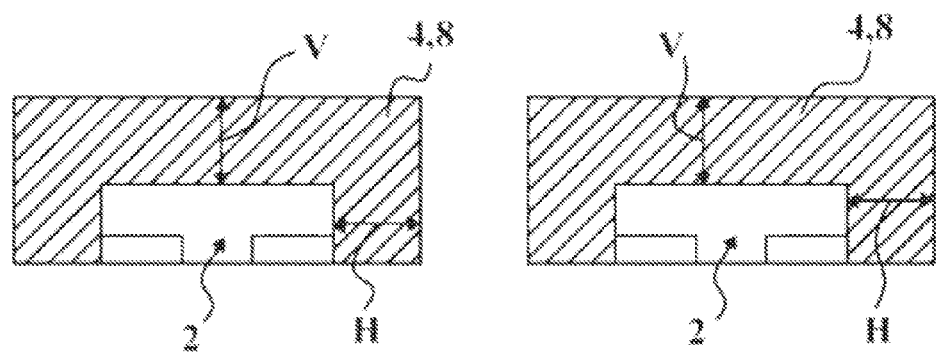

FIG. 34 to FIG. 36 are views illustrating one example of the method for manufacturing the semiconductor device structure shown in FIG. 11. Here, the semiconductor devices 2 and 2 being secured to the plate 1 by means of an adhesive 3 are covered with the encapsulating material 4 containing a phosphor, that is, a phosphor layer 8. Next, the plate 1 is removed as shown in FIG. 35, and the semiconductor devices 2 and 2 are separated from each other. This method enables to conformally coat the semiconductors devices 2 and 2 with a so-called phosphor or the phosphor layer 8. Moreover, the phosphor layer 8 can be made to have the height V and the width H of the same dimensions. Therefore, there is a big distinction between this type of conformal coating (the configuration of a conformal coating through the removal of the encapsulating material 4 or through the removal of the phosphor layer 8) and the conventional conformal coating achieved by spin coating, screen printing or the like in the art.

Figure 37:
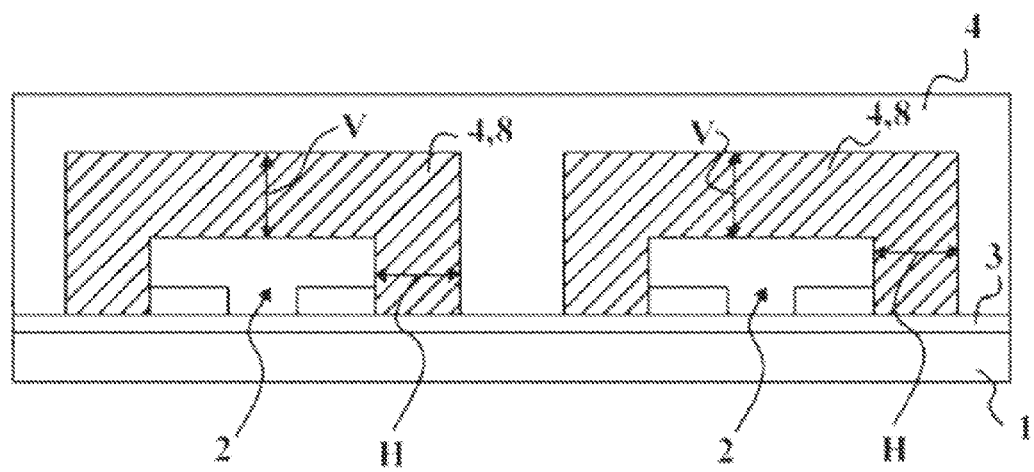
FIG. 37 is a view illustrating yet another example of the method for manufacturing a semiconductor device structure according to the present disclosure.

FIG. 37 is a view illustrating yet another example of the method for manufacturing a semiconductor device structure according to the present disclosure, in which the semiconductor devices 2 and 2 manufactured in FIG. 36 are placed on the plate 1 by means of the adhesive 3 again, and coated with the encapsulating material 4 again. The encapsulating material 4 may additionally include other phosphors and/or small particles for scattering the light. Unlike the conventional way, it is easier to control the shape of an interface between the phosphor layer 8 and the encapsulating material 4. Indeed, the outer configuration of the phosphor layer 8 as well as the outer configuration of the encapsulating material 4 covering the phosphor layer 8 can easily be controlled. Meanwhile, the phosphor may be introduced into the external encapsulating material 4, but not into the internal encapsulating material 4. In other words, the external encapsulating material 4 can become a phosphor layer. The same principles as those described above is also applied to this case, i.e., it is possible to control the interface between the both sides, and to control the outer configurations thereof. The encapsulating material 4 that constitutes the phosphor layer 8 and the encapsulating material 4 that covers the phosphor layer 8 may be the same material, or may be different materials having different properties from each other (refractive index, hardness, light transmission, curing rate, etc.). Accordingly, this embodiment can expand its scope of application to the method for manufacturing a semiconductor device structure according to the present disclosure, which incorporates the same or different encapsulating material(s) at least two times. When the semiconductor device has such a phosphor layer 8, it is suitable for use as a semiconductor light emitting device. However, even when the semiconductor device does not contain any phosphor, it would not necessarily be a semiconductor light emitting device.

Figure 38:
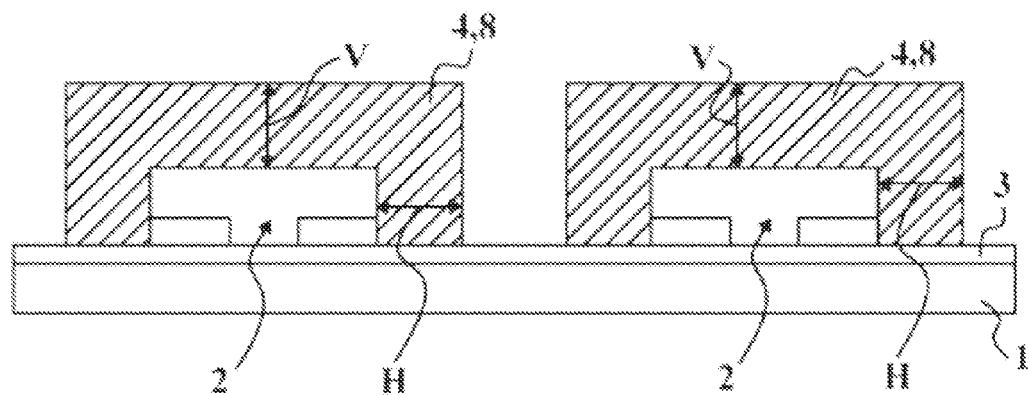
FIG. 38 is a view illustrating yet another example of the method for manufacturing a semiconductor device structure according to the present disclosure.

FIG. 38 is a view illustrating yet another example of the method for manufacturing a semiconductor device structure according to the present disclosure. As in FIG. 34, after the phosphor layer 8 is formed, part of the phosphor layer 8 is removed, without performing a process for removing the plate 1, and the phosphor layer 8 is conformally formed on each of the semiconductor devices 2 and 2. In case that the process of FIG. 37 proceeds later on, the method in this example has an advantage of reducing the number of the use of the plate 1 to once.

Figure 39:
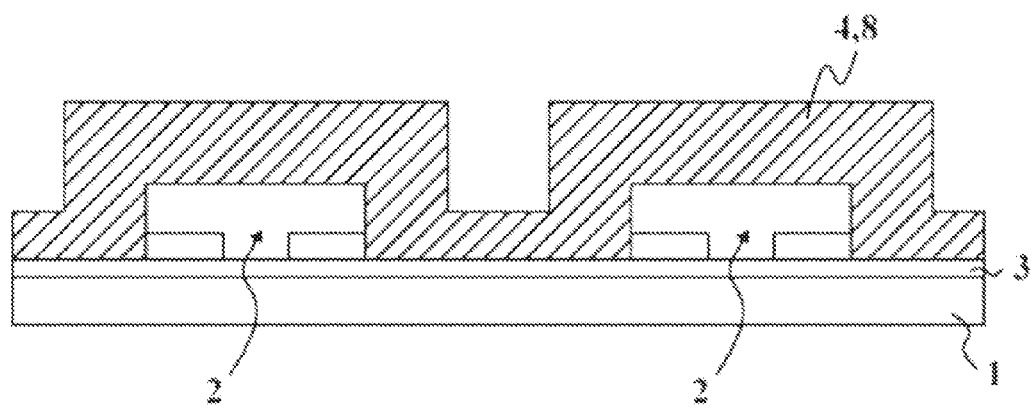
FIG. 39 to FIG. 41 are views illustrating one example of the method for manufacturing the semiconductor device structure shown in FIG. 12.
Figure 40:
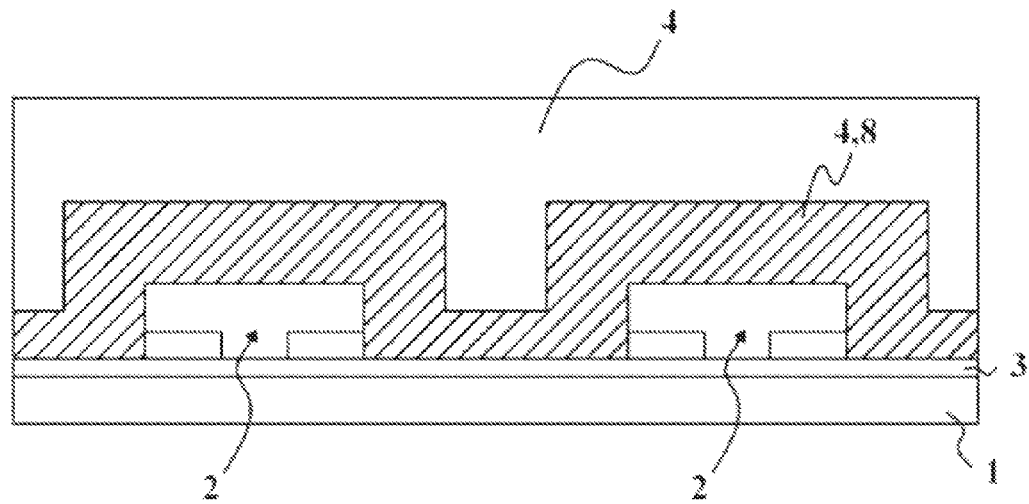
Figure 41:
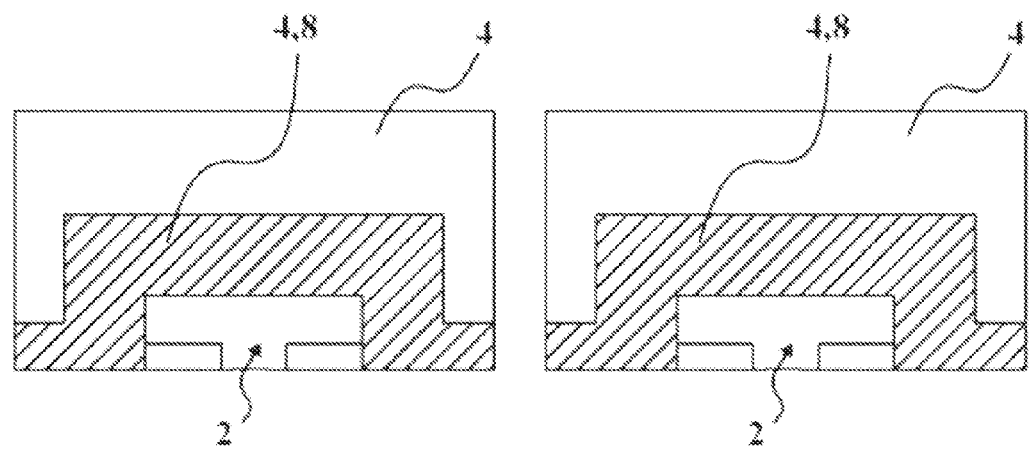

FIG. 39 to FIG. 41 are views illustrating one example of the method for manufacturing the semiconductor device structure shown in FIG. 12. Unlike the method shown in FIG. 38, the phosphor layer 8 is subjected to a partial removal, instead of a complete removal, leaving part of the phosphor layer 8. Next, the semiconductor devices 2 and 2 are covered with the encapsulating material 4 as shown in FIG. 40 and then separated as shown in FIG. 41, thereby obtaining a semiconductor device structure. Naturally, the encapsulating material 4 can have diverse configurations, including one shown in FIG. 13 and one shown in FIG. 14, for example.

Figure 42:
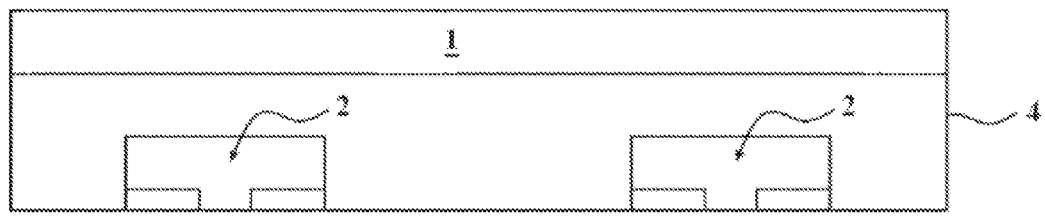
FIG. 42 and FIG. 43 are views illustrating yet another example of the method for manufacturing a semiconductor device structure according to the present disclosure.
Figure 43:
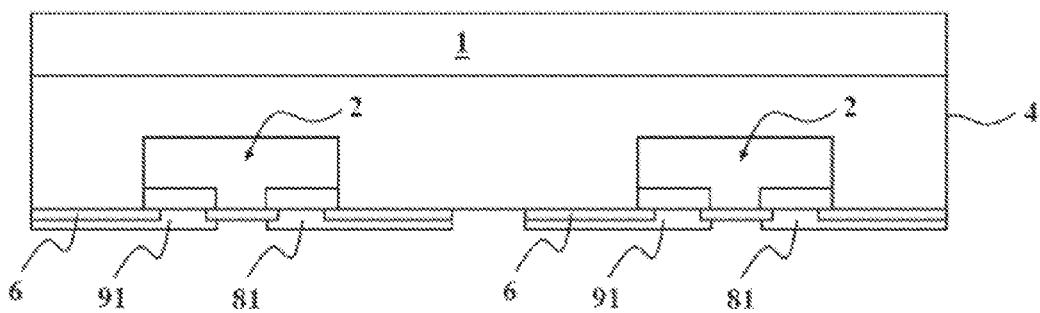
Figure 44:
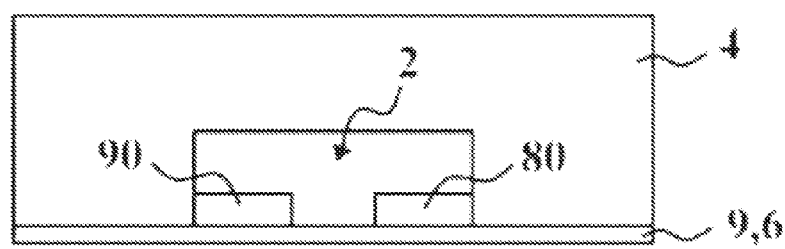
FIG. 44 to FIG. 47 are views illustrating yet another example of the method for manufacturing a semiconductor device structure according to the present disclosure.

FIG. 42 and FIG. 43 are views illustrating yet another example of the method for manufacturing a semiconductor device structure according to the present disclosure. As shown in FIG. 42, the plate 1 is attached to the encapsulating material 4. The attachment of the plate 1 to the encapsulating material 4 can be carried out by the same method as one illustrated in FIG. 3. The plate 1 can be attached to the encapsulating material 4, before or after being separated from the electrode 2 in FIG. 3 to which the plate 1 has been attached. In this embodiment, it is important that the plate 1 does not bend like a plate made of flexible materials. As shown in FIG. 43, once the plate 1 as shown in FIG. 3 is removed, a number of various processes including the formation of an insulating film 6, the formation of external electrodes 81 and 91, cutting the encapsulating material 4, and/or a photolithography process involved are required, and it is very crucial at this point that the encapsulating material 4 of merely a few mm height should retain its planar profile. To this end, it is essential to use a rigid plate 1. As the material of the plate 1, it is possible to use ceramic, glass, metal, engineering plastic or the like. The thickness of the plate 1 may vary depending on the material used, but it is desirable to maintain an optimal thickness, in order to prevent bending and to maintain the mechanical stability.

For instance, any thickness equal to or greater than 1 mm would be sufficient for a glass substrate. The plate 1 can be removed before or after cutting those two semiconductor devices 2 and 2.

Figure 1:
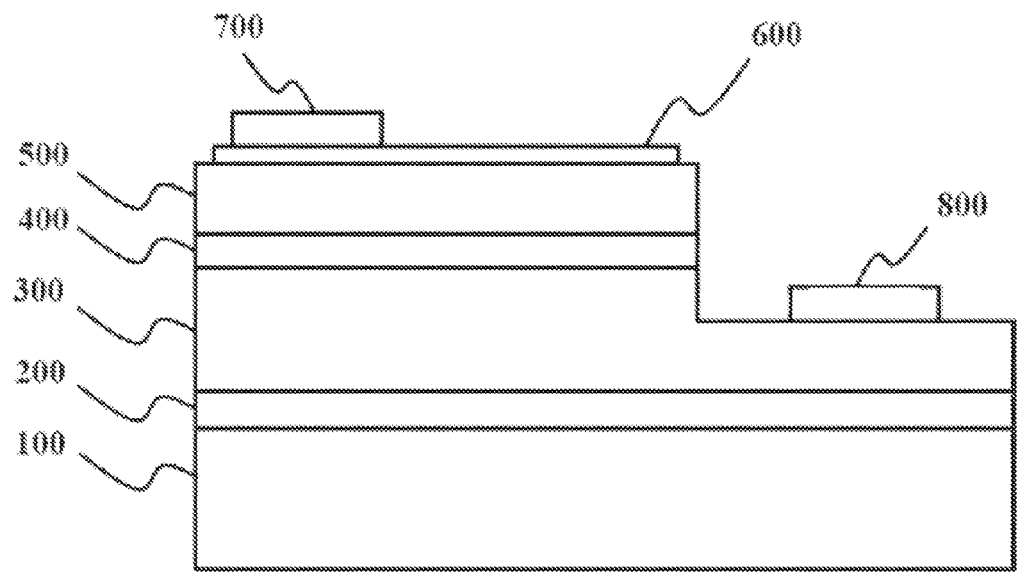
FIG. 1 is a view illustrating one example of a semiconductor light emitting device (Lateral Chip) in the prior art.
Figure 45:
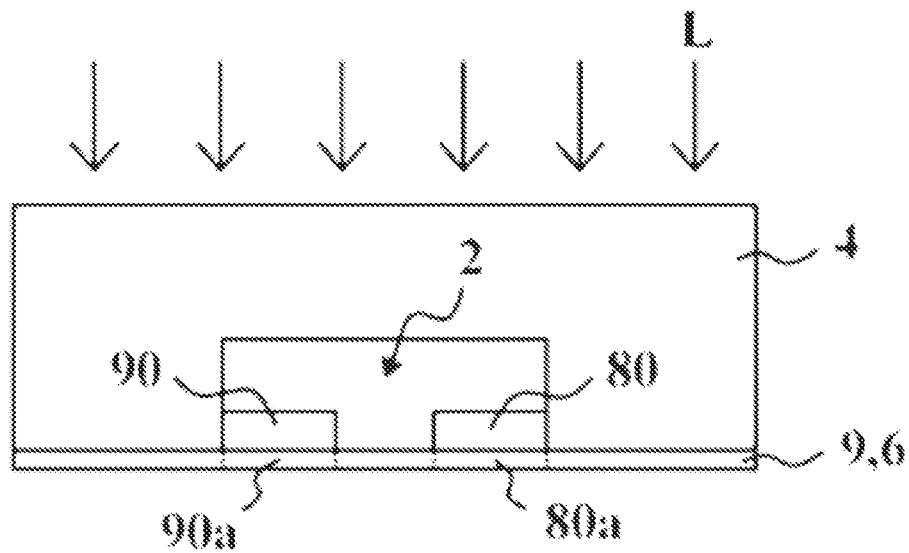
Figure 46:
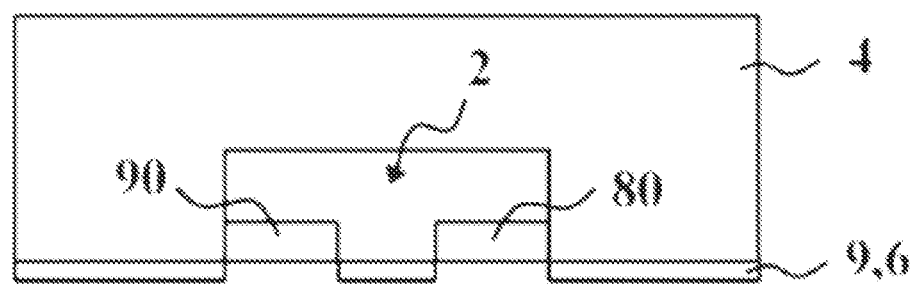
Figure 47:
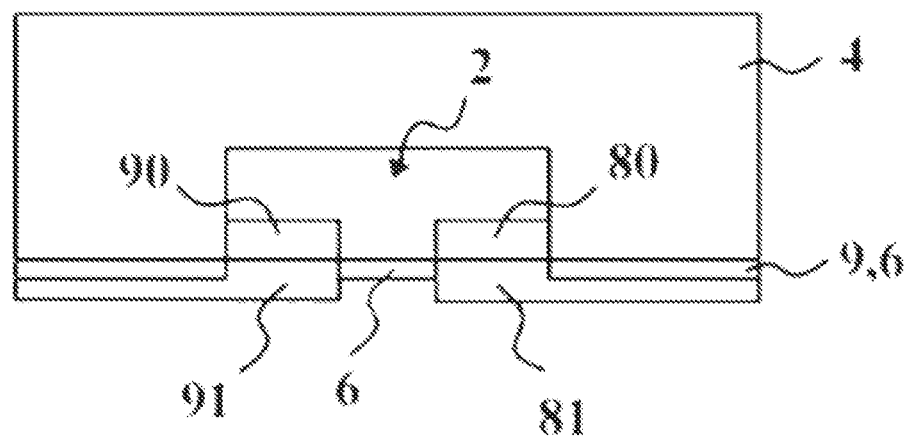

FIG. 44 to FIG. 47 are views illustrating yet another example of the method for manufacturing a semiconductor device structure according to the present disclosure, in which a photoresist 9 is applied following the removal of the plate 1 (see FIG. 3). For example, the photoresist 9 can be composed of white PSR serving as the insulating film 6. An exposure operation is needed to expose the electrodes 80 and 90. For a mask pattern, instead of using an additional mask pattern, the electrodes 80 and 90 are used as masks. After that, as shown in FIG. 45, light L is irradiated from the upper side of the encapsulating material 4 such that the photoresist 9 can be exposed, and regions 80a and 90a corresponding to the electrodes 80 and 90 can be removed after the exposure. FIG. 46 shows how those regions 80a and 90a look after the photoresist 9 is removed. Preferably, the encapsulating material 4 is free of a phosphor such that the light L can be properly transferred to the photoresist 9. Now that the electrodes 80 and 90 are used as masks, and that an alignment operation for an additional mask used is no longer required, a more accurate exposure operation can be performed. If necessary, as shown in FIG. 47, the external electrodes 81 and 91 are electrically connected to the electrodes 80 and 90, respectively. With the photoresist 9 being composed of white PSR, the photoresist 9 can now serve as an insulating film 6 and a light reflective film at the same time. Even a semiconductor device should be light-transmissive overall. For example, in case of a group III-nitride semiconductor device, as in FIG. 1, it can be formed into a light-transmitting semiconductor on a transparent sapphire substrate, a GaN substrate or a SiC substrate. That is, as the semiconductor device 2 and the encapsulating material 4 are light-transmissive, the light L used for the exposure can go through them and be applied to the photoresist 9.

Figure 48:
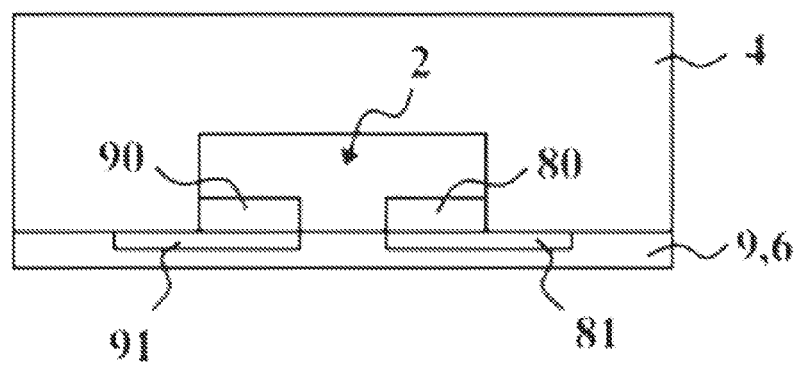
FIG. 48 is a view illustrating yet another example of the method for manufacturing a semiconductor device structure according to the present disclosure.

FIG. 48 is a view illustrating yet another example of the method for manufacturing a semiconductor device structure according to the present disclosure, in which the external electrodes 81 and 91 are formed, prior to the formation of the photoresist 9 or the insulating film 6. In this case, the electrodes 80 and 90 as well as the external electrodes 81 and 91 can be employed as masks during the exposure. Unlike the electrodes 80 and 90, of which shape and size are limited by the size and characteristics of the semiconductor device 2, the external electrodes 81 and 91 are not limited by the semiconductor device 2, if necessary, they can be designed in a high degree of freedom and take any desirable pattern.

Figure 49:
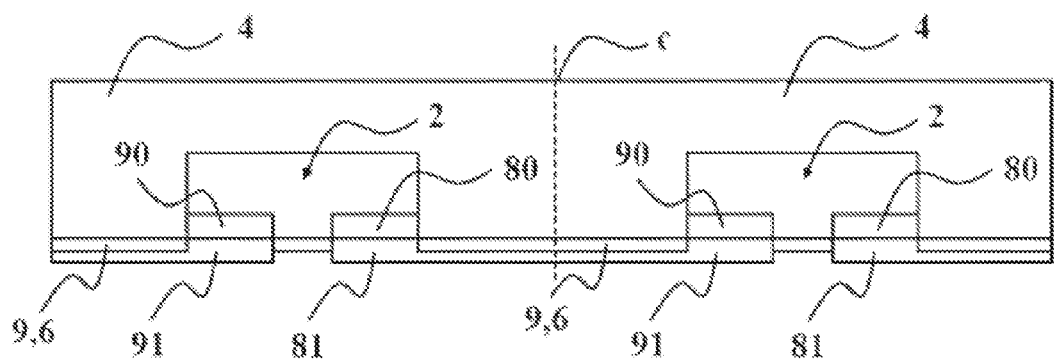
FIG. 49 is a view illustrating yet another example of the method for manufacturing a semiconductor device structure according to the present disclosure.

FIG. 49 is a view illustrating yet another example of the method for manufacturing a semiconductor device structure according to the present disclosure, in which a plurality of semiconductor devices 2 and 2 are being cut. When the semiconductor device structure is manufactured by the method of FIG. 44 to FIG. 47, the photoresist 9 located below the external electrodes 81 and 91 is split together with the encapsulating material 4 at the time of cutting the semiconductor devices 2 and 2 along a cutting line C.

Figure 50:
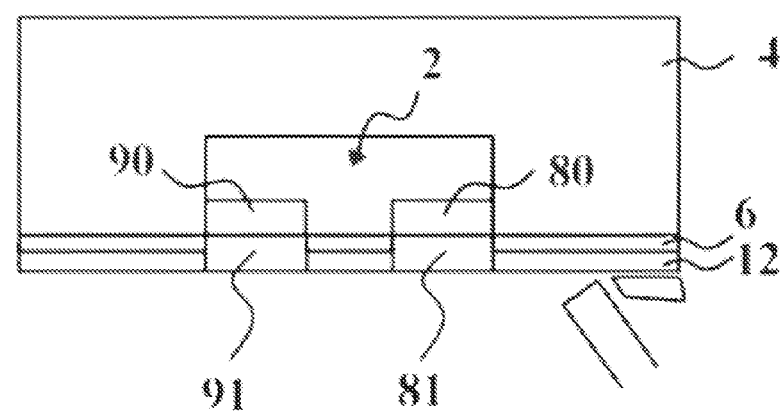
FIG. 50 is a view illustrating yet another example of the method for manufacturing a semiconductor device structure according to the present disclosure.

FIG. 50 is a view illustrating yet another example of the method for manufacturing a semiconductor device structure according to the present disclosure, in which the external electrodes 81 and 91 are formed by a stencil method using a mask 12. When a solder paste is applied to the external electrodes 81 and 91, the semiconductor device structure can be directly mounted onto the PCB or the like.

Figure 51:
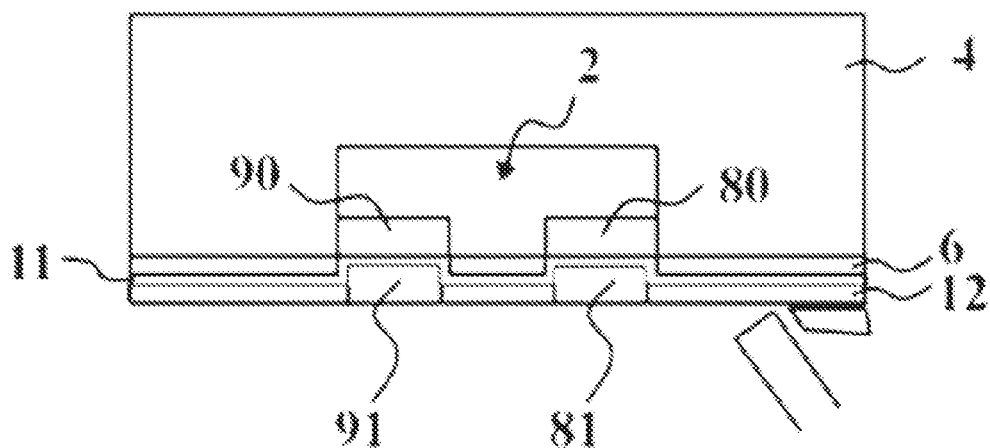
FIG. 51 and FIG. 52 are views illustrating yet another example of the method for manufacturing a semiconductor device structure according to the present disclosure.
Figure 52:
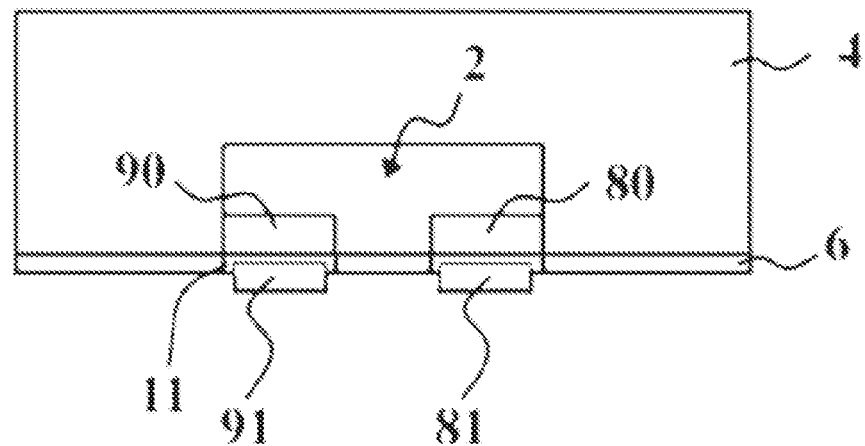

FIG. 51 and FIG. 52 are views illustrating yet another example of the method for manufacturing a semiconductor device structure according to the present disclosure, in which an adhesive layer 11 (e.g. Cu, Sn, etc.) is formed into a thin layer, prior to the formation of the external electrodes 81 and 91. Next, as shown in FIG. 52, the adhesive layer not being covered with the mask 12 and the external electrodes 81 and 91 is removed, and the semiconductor device structure as shown in FIG. 50 can thus be obtained. The adhesive layer 11 enhances the bonding strength between the external electrodes 81 and 91 and the electrodes 80 and 90.

Figure 53:
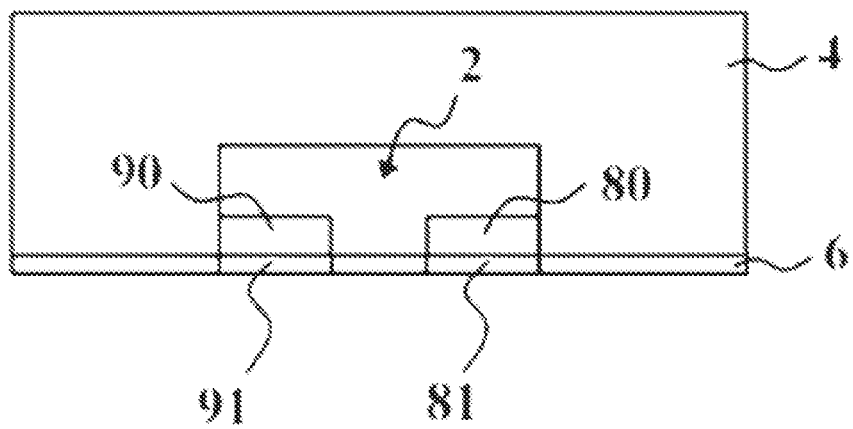
FIG. 53 is a view illustrating yet another example of the method for manufacturing a semiconductor device structure according to the present disclosure.

FIG. 53 is a view illustrating yet another example of the method for manufacturing a semiconductor device structure according to the present disclosure, in which, after the insulating film 6 is formed, the external electrodes 81 and 91 are formed simply by electroless plating, without any etching process.

Figure 54:
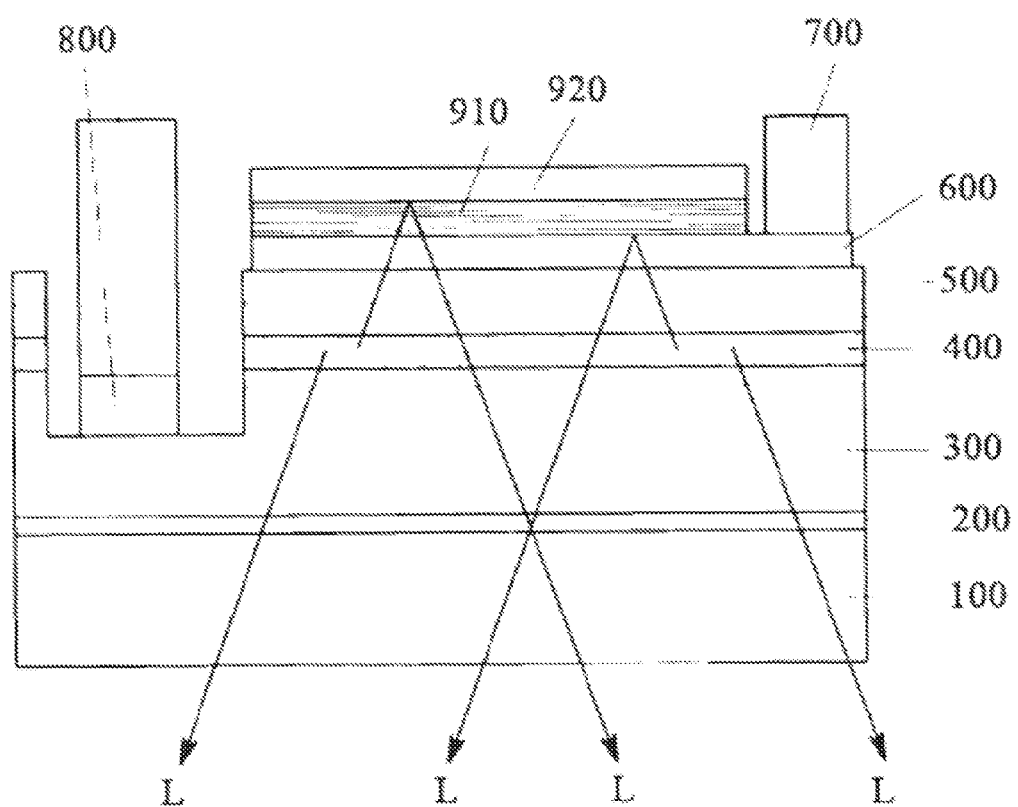
FIG. 54 is a view illustrating one example of the semiconductor light emitting device (Flip Chip) proposed in JP Laid-Open Publication No. 2006-120913.
Figure 55:
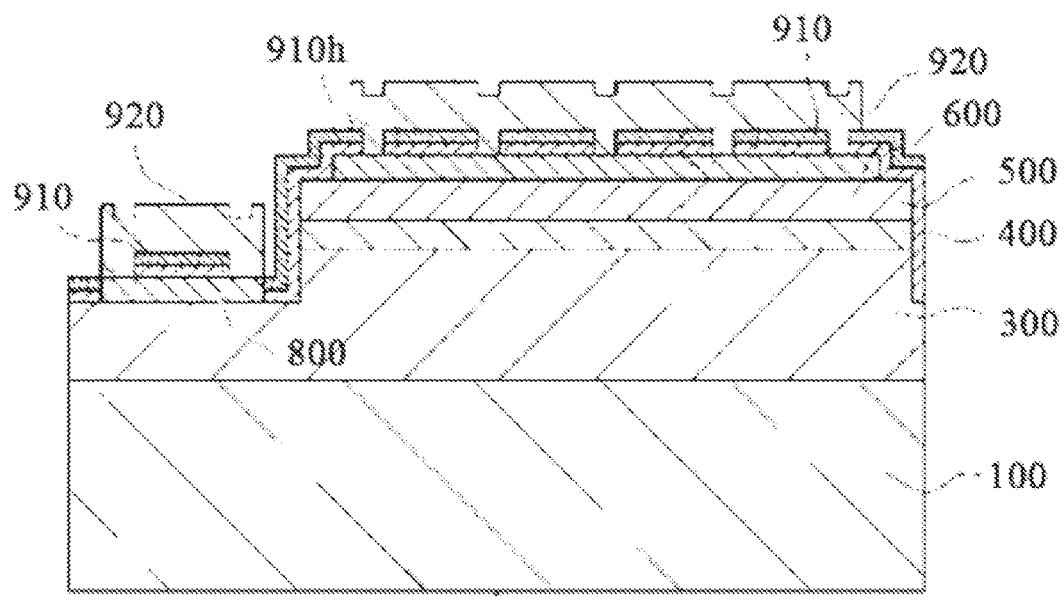

Referring back to FIG. 2, in a semiconductor device structure (e.g. a semiconductor light emitting device) to be manufactured in practice, the electrode 800 and the electrodes 901, 902 and 903 have a structure with a limited configuration, depending on the specifications required of the semiconductor device structure. Thus, this means, although the electrodes 800 and the electrodes 901, 902 and 903 may be employed as exposure masks according to the present disclosure, one cannot change their shapes arbitrarily. In FIG. 2, for example, the electrodes 901, 902 and 903 are only formed across the entire second semiconductor layer 500, and on the exposed, first semiconductor layer 300 as a result of etching the electrode 800. Likewise, the semiconductor device light emitting devices illustrated in FIG. 54 and FIG. 55 are not exempt from these restrictions, either.

Another aspect of the present disclosure is to provide a method for manufacturing a semiconductor device structure having no restrictions described above.

Figure 56:
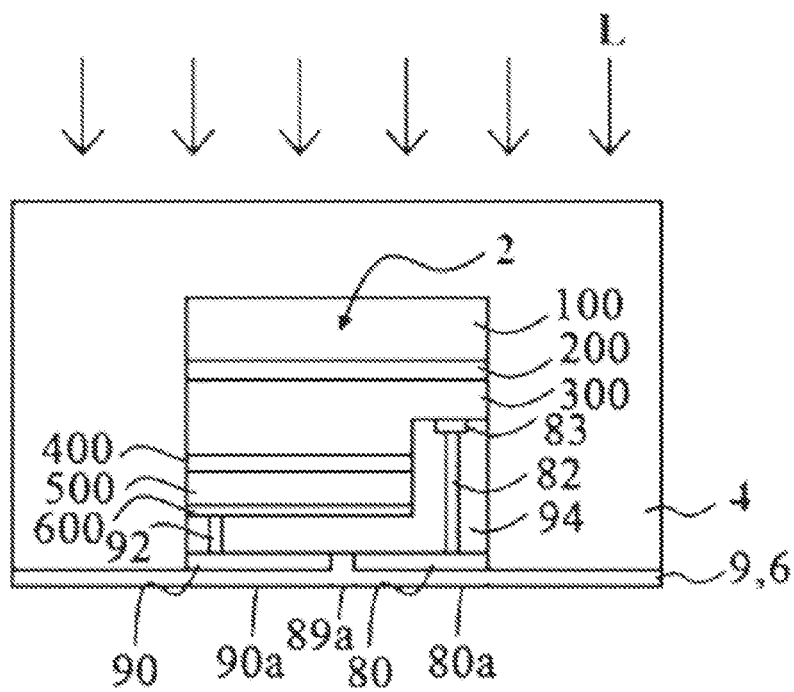
FIG. 56 is a view illustrating yet another example of the method for manufacturing a semiconductor device structure according to the present disclosure.

FIG. 56 is a view illustrating yet another example of the method for manufacturing a semiconductor device structure according to the present disclosure, in which the photoresist 9 is applied after the removal of the plate 1 (see FIG. 3). For example, the photoresist 9 may be composed of white PSR serving as the insulating film 6. An exposure operation is needed to expose the electrodes 80 and 90. For a mask pattern, instead of using an additional mask pattern, electrodes 80 and 90 are used as masks. After that, light L is irradiated from the upper side of the encapsulating material 4 such that the photoresist 9 can be exposed, and regions 80a and 90a corresponding to the electrodes 80 and 90 can be removed after the exposure. Preferably, the encapsulating material 4 is free of a phosphor such that the light L can be properly transferred to the photoresist 9. Unlike this, the encapsulating material 4 can contain a phosphor to allow the phosphor to scatter the light L, thereby facilitating the exposure. Any description of the same reference numerals 100, 200, 300, 400, 500 and 600 will not be repeated. Unlike the semiconductor device 2 shown in FIG. 45, the electrodes 80 and 90 are not directly formed on the first semiconductor layer 300 and on the light-transmitting conductive film 600, but a dielectric film 94 having a DBR is interposed between the electrodes 80 and 90 and the layers 300 and 600, and there are electrical connections 82 and 92 for electrical communication between the layers 300 and 600 and the electrodes 80 and 90. In other words, the electrodes 80 and 90 are electrically connected to the first semiconductor layer 300 and the second semiconductor layer 500, respectively, passing through the dielectric film 94. Naturally, each electrical connection 82 and 92 may be provided in plural numbers. Preferably, for an ohmic contact with the first semiconductor layer 300, an electrode 83 may be formed beforehand. If appropriate, it is perfectly acceptable to form the electrode 83 into an elongated finger electrode extending along the first semiconductor layer 300. Such a finger electrode can also be formed between the light-transmitting conductive film 600 and the electrical connection 92 such that the current supply to the entire semiconductor device 2 can be facilitated. The light-transmitting conductive film 600 may be omitted. With this configuration, the electrodes 80 and 90 can have a form, without being restricted by the semiconductor device 2. The dielectric film 94 having a DBR serves to reflect light generated in the active layer 400 towards the substrate 100, and is thus designed to adapt to the wavelength of the light generated in the active layer 400. For instance, when the active layer 400 generates a blue wavelength (e.g. 450 nm) and the DBR is composed of a stack of a repeating pattern of $SiO_2/TiO_2$, each DBR layer is designed to have a thickness of 450 nm/$\lambda_{SiO2}$ and a thickness of 450 nm/$\lambda_{TiO2}$. For example, if a UV-reactive photoresist 9 is used for the insulating film 6 and if a UV-wavelength light L is irradiated thereto, part of the light L passes through the DBR, enabling to expose a region 89a between the electrode 80 and the electrode 90. Needless to say, it is also possible to employ any light L having a longer wavelength than that of the light generated in the active layer 400.

Figure 57:
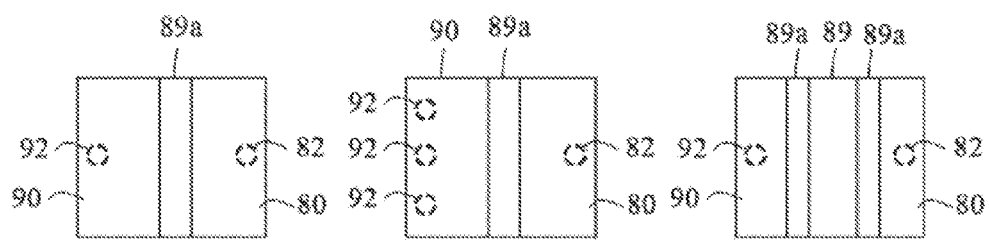
FIG. 57 is a view illustrating examples of electrodes in the semiconductor device shown in FIG. 56.

FIG. 57 is a view illustrating other examples of the semiconductor device shown in FIG. 56. In the drawing, the left-hand side view shows that the electrodes 80 and 90 can be arranged symmetrically; the view at the center shows that a plurality of electrical connections 92, 92 and 92 can be provided; and the right-hand side view shows that, in addition to the electrodes 80 and 90, a heat-dissipation metal film 89 having regions 89a and 89a formed on both sides is formed. Although rectangular-shaped electrodes 80 and 90 are illustrated, the electrodes are not particularly limited thereto.

Hereinafter, exemplary embodiments of the present disclosure will be described.

(1) A semiconductor device structure, wherein an encapsulating material serves as a carrier.

(2) The semiconductor device structure, wherein the bottom face of the encapsulating material is separated from a plate.

(3) The semiconductor device structure, wherein the outer faces of the encapsulating material form the outer faces of the structure or package, except for the side where the electrodes of the semiconductor device are located.

(4) The semiconductor device structure, wherein semiconductor devices are bonded using the encapsulating material.

(5) A method for manufacturing a semiconductor device structure, comprising the steps of: securing the position of a semiconductor device on a plate; securing the positions of electrodes such that they face the plate; covering the semiconductor device with an encapsulating material; and separating, from the plate, the semiconductor device covered with the encapsulating material.

(6) The method for manufacturing a semiconductor device structure, further comprising the step of forming irregularities by pressing the side where the electrodes of the semiconductor device are located.

(7) The method for manufacturing a semiconductor device structure, further comprising the steps of: at the opposite side of the covered semiconductor device with the encapsulating material, forming a heat-dissipating pad on at least part of the semiconductor device and of the encapsulating material, thereby producing an electrical insulation from the electrodes.

(8) The method for manufacturing a semiconductor device structure, wherein in the step of securing the position, two semiconductor devices are secured at positions on the plate, and electrodes of each of the two semiconductor devices are secured such locations that the electrodes face the plate; wherein in the covering step, the two semiconductor devices are covered with a first encapsulating material, at least part of the first encapsulating material between the two semiconductor devices is then removed, and, with the two semiconductor devices being remained covered with the first encapsulating material, the two semiconductor devices having been covered with the first encapsulating material are covered with a second encapsulating material; and wherein in the separation step, the two semiconductor devices covered with the first and second encapsulating materials are separated.

(9) The method for manufacturing a semiconductor device structure, further comprising the step of: after the covering step, attaching a plate made of rigid materials to the encapsulating material.

(10) The method for manufacturing a semiconductor device structure, further comprising the steps of: covering the side where the electrodes of the semiconductor device are located with photoresist; and exposing the photoresist, using the electrodes as masks.

(11) The method for manufacturing a semiconductor device structure, further comprising the step of: forming external electrodes in the electrodes by a stencil method or electroless plating, or by means of a solder paste. This process is not always accompanied with a process for exposing the electrodes with a mask. Preferably, an adhesive layer is interposed between the electrodes and the external electrodes, so as to enhance the adhesive strength between them.

(12) The method for manufacturing a semiconductor device structure, wherein, in the step of securing the position, the semiconductor device is a light-transmitting device and has two electrodes thereon using a dielectric film having a DBR (Distributed Bragg Reflector) as a medium, and the two electrodes are electrically connected with the semiconductor device by passing through the dielectric film and are secured at such positions on the plate that the electrodes face the plate; and wherein, in the exposing step, the photoresist is exposed, using the two electrodes as masks.

In one method for manufacturing a semiconductor device structure according to the present disclosure, it is possible to manufacture a semiconductor device structure or package in an easier manner.

In another method for manufacturing a semiconductor device structure according to the present disclosure, it is possible to obtain a structure or package where an encapsulating material serves as a carrier.

In yet another method for manufacturing a semiconductor device structure according to the present disclosure, it is possible to obtain a light emitting device structure or package where a light-transmitting encapsulating material serves as a carrier.

In yet another method for manufacturing a semiconductor device structure according to the present disclosure, it is possible to electrically connect a plurality of semiconductor devices in an easier manner.

In yet another method for manufacturing a semiconductor device structure according to the present disclosure, it is possible to electrically connect semiconductor devices of different configurations in an easier manner.

In yet another method for manufacturing a semiconductor device structure according to the present disclosure, it is possible to form an uneven surface or irregularities on the encapsulating material.

In yet another method for manufacturing a semiconductor device structure according to the present disclosure, the formation of irregularities enables to improve the bonding strength between the encapsulating material, the insulating film and/or the external electrodes.

In yet another method for manufacturing a semiconductor device structure according to the present disclosure, it is possible to increase the efficiency of heat dissipation as well as the efficiency of light reflection.

In yet another method for manufacturing a semiconductor device structure according to the present disclosure, it is possible to control the configuration of a phosphor layer in an easier manner.

In yet another method for manufacturing a semiconductor device structure according to the present disclosure, it is possible to expose the insulating film, without the use of an additional mask pattern.

In yet another method for manufacturing a semiconductor device structure according to the present disclosure, it is possible to have a high level of freedom in designing the electrodes that are used as exposure mask patterns.

What is claimed:

1. A semiconductor device structure comprising:
    a semiconductor device, including a first semiconductor layer having a first conductivity and having an etch-exposed portion, an active layer for generating light via electron-hole recombination, and a second semiconductor layer having a second conductivity different from the first conductivity, which are stacked over a substrate in the order mentioned, and a first electrode and a second electrode formed at the side where the second semiconductor layer is located and electrically connected to the first semiconductor layer and the second semiconductor layer, respectively;
    a distributed bragg reflector covering the second semiconductor layer and the etch-exposed portion of the first semiconductor layer to reflect light generated from the active layer toward the substrate; and
    an encapsulating material, which is made of a light-transmitting material having a top face, a bottom face opposite to the top face, and with which the semiconductor device is covered from the first semiconductor layer side to the second semiconductor layer side without covering the first and second electrodes so as to expose the first and second electrodes through the bottom face of the encapsulating material,
    wherein the first and second electrodes are located under the distributed bragg reflector, and the distributed bragg reflector is positioned between the second semiconductor layer and the first and second electrodes.

2. The semiconductor device structure according to claim 1, wherein the semiconductor device except the first and second electrodes thereof is made of a light-transmitting material.

3. The semiconductor device structure according to claim 1, wherein at least part of the encapsulating material is provided with a phosphor.

4. The semiconductor device structure according to claim 1, wherein a lens is formed integrally with the top face of the encapsulating material.

5. The semiconductor device structure according to claim 1, wherein light reflectors are formed integrally with the lateral faces of the encapsulating material.

6. The semiconductor device structure according to claim 1, further comprising:
    a white insulating film on the bottom surface, so as to expose the first and second electrodes.

7. The semiconductor device structure according to claim 2, wherein at least part of the encapsulating material is provided with a phosphor.

8. The semiconductor device structure according to claim 7, wherein a lens is formed integrally with the top face of the encapsulating material.

* * * * *